(12) United States Patent
Jessop et al.

(10) Patent No.: US 8,688,423 B2
(45) Date of Patent: Apr. 1, 2014

(54) SUBSURFACE HYDROGEOLOGIC SYSTEM MODELING

(75) Inventors: Michael L. Jessop, Eagle Mountain, UT (US); Michael J. Wallace, Midvale, UT (US); Wei Qian, Markham (CA); Jerry R. Montgomery, West Jordan, UT (US); Rondo Jeffery, Roy, UT (US); Val O. Kofoed, Spanish Fork, UT (US)

(73) Assignee: Willowstick Technologies, LLC, Draper, UT (US)

( * ) Notice: Subject to any disclaimer, the term of this patent is extended or adjusted under 35 U.S.C. 154(b) by 285 days.

(21) Appl. No.: 13/363,158

(22) Filed: Jan. 31, 2012

(65) Prior Publication Data

US 2013/0197891 A1 Aug. 1, 2013

(51) Int. Cl.
*G06G 7/48* (2006.01)
(52) U.S. Cl.
USPC .............................. 703/9; 702/12; 73/152.29
(58) Field of Classification Search
USPC ..................... 703/6, 9, 22; 239/10; 702/5, 12; 73/152.29
See application file for complete search history.

(56) References Cited

U.S. PATENT DOCUMENTS

| | | | |
|---|---|---|---|
| 5,553,492 A * | 9/1996 | Barrett et al. | 73/152.29 |
| 5,825,188 A | 10/1998 | Montgomery et al. | |
| 6,002,863 A * | 12/1999 | Sheer et al. | 703/22 |
| 6,603,313 B1 | 8/2003 | Srnka | |
| 7,136,756 B1 * | 11/2006 | Vieux et al. | 702/5 |
| 7,324,899 B2 | 1/2008 | Zhdanov | |
| 2007/0294036 A1 | 12/2007 | Strack et al. | |
| 2008/0071709 A1 | 3/2008 | Strack | |
| 2012/0067644 A1 | 3/2012 | Goswami et al. | |
| 2012/0241536 A1 * | 9/2012 | Pullen et al. | 239/10 |

OTHER PUBLICATIONS

"White Paper on Willowstick Technology Used for Mapping and Modeling Groundwater Systems"; 2011 Willowstick Technologies LLC.
Kodoed, et al.; "Unique applications of MMR to track preferential groundwater flow paths in dams, mines, environmental sites, and leach fields"; *The Leading Edge*; Feb. 2011.

* cited by examiner

*Primary Examiner* — Kandasamy Thangavelu
(74) *Attorney, Agent, or Firm* — Thorpe North & Western LLP

(57) ABSTRACT

A method of modeling a subsurface hydrogeologic system within a study area can include applying an electric current directly to the subsurface hydrogeologic system and monitoring a magnetic field generated by the electric current in the subsurface hydrogeologic system. An electric current distribution can be identified within the study area by an inversion process based on the magnetic field. A model of the electric current distribution can be created.

23 Claims, 19 Drawing Sheets

SUBSURFACE HYDROGEOLOGIC SYSTEM MODELING

BACKGROUND

Current techniques for tracking groundwater or subsurface solutions typically involves indirect geophysical methods such as various forms of galvanic resistivity, electromagnetic conductivity, ground penetrating radar, or the drilling and logging of observation wells.

Geophysical methods can be broadly classified into two groups—passive and active. Passive methods detect variations in the earth's natural fields, such as gravitational or magnetic fields. These methods are not suited for characterizing preferential groundwater flow paths and usually cannot resolve acute subsurface changes. Although passive methods have been used with limited success in mapping groundwater flow paths, the data obtained by the method can be very difficult to interpret and is generally unreliable without other supporting data.

Active methods, on the other hand, transmit manmade signals into the earth—such as sound waves or electric currents—which are subsequently measured after passing through and being modified by subsurface materials. Active methods are better suited for many types of exploration, including groundwater characterization.

Some geophysical methods energize a large volume of the subsurface-combining and averaging the earth's response between rock, soil and water resulting in a mixed bag of responses that are often difficult to interpret and insensitive to acute changes in subsurface conditions. Over the past several years, three-dimensional (3D) seismic methods have proven to be helpful in characterizing groundwater bodies. However, a major drawback to 3D seismic methods is the cost and difficulty in performing surveys on land (i.e., over difficult to access land such as steep terrain, highly vegetated and/or populated areas). Electrical methods such as direct current (DC) resistivity and electromagnetic (EM) methods are used more commonly for groundwater characterization. These methods energize the subsurface volume as a whole and utilize non-conductive overburden to achieve good penetration and signal fidelity. Successful application of these technologies can be limited by wet clays, conductive soils, and surface water. Data acquisition is also highly affected by electrical interference and metal objects. Even with good penetration, the averaging of signals that have travelled through a large volume of subsurface material yields ambiguous results. Altogether, these methods have serious limitations as tools for groundwater characterization.

Another active technique that may be used to characterize groundwater is ground penetrating radar (GPR). This technique uses electromagnetic wave propagation and scattering to identify changes in electrical properties. This technique can be more accurate. However, GPR depth resolution is limited to only a few meters or less if clays are present and is not well-suited for coverage of large areas.

Drilling and logging of wells is another option for identifying and/or tracking subsurface water solutions. A drawback to drilling is that drilling does not reveal more than what is at the location of the drill hole. To establish linkage between holes, a tracer solution or some geophysical continuity test is often used. Geophysical techniques used to establish connectivity between holes is to place an electrode in one hole at the horizon of interest and then lower another electrode in the second hole to see if there is a response at the horizon of interest in the second hole. This technique may establish connectivity but does not provide a surface trace of the path that the water follows between the drill holes. Confidently mapping a subsurface water system, following subsurface pollution plumes, identifying all branches of a groundwater source, or recognizing all offshoots of a pollution plume can be difficult with drilling. In addition, drilling can miss a narrow stream of groundwater with a well and thus produce inconclusive or misleading results.

A method to map groundwater plumes using electrical resistance tomography (ERT) and electro kinetic system (EKS) was developed which places many electrodes on the surface and in wells and measures all combinations of resistivity between them. The water or fluids are then caused to move using electro kinetics. Subsequently, the various resistivity combinations are remeasured. This data is combined to create a tomography picture that results from the displacement of the plume.

Despite the development of the various technologies listed, and others, such methods and technologies are inadequate for hydrogeologic characterization. Also, ERT, EKS, IP, and so forth are limited in effectiveness when other electrical lines, magnetic fields, underground infrastructure (including metal), and so forth are present. Additionally, use of such technologies within densely populated areas can be difficult.

SUMMARY

A method of modeling a subsurface hydrogeologic system within a study area, in accordance with an example of the present technology, can include applying an electric current directly to the subsurface hydrogeologic system and monitoring a magnetic field generated by the electric current in the subsurface hydrogeologic system. An electric current distribution can be identified within the study area by an inversion process based on the magnetic field. A model of the electric current distribution can be created.

A method of modeling a subsurface hydrogeologic system, in accordance with an example of the present technology, can include applying an electric current directly to the subsurface hydrogeologic system and monitoring a magnetic field generated by the electric field in the subsurface hydrogeologic system. Pathways can be identified that simulate flow of the electric current with a degree of channeling greater than a predetermined amount based on an assumption of homogeneity of a subsurface including the subsurface hydrogeologic system. The magnetic field can be simulated based on the pathways at a depth within the subsurface. The depth can be adjusted such that the simulated magnetic field corresponds to the monitored magnetic field.

A system for modeling a subsurface hydrogeologic system, in accordance with an example of the present technology, can include electrodes for applying an electric current directly to the subsurface hydrogeologic system and a monitoring device configured to monitor a magnetic field generated by the electric field in the subsurface hydrogeologic system. A processor can perform at least one of: identifying an electric current distribution within the study area by an inversion process based on the magnetic field, and simulating pathways within the electric current distribution with a degree of channeling greater than a predetermined amount based on an assumption of homogeneity of a subsurface including the subsurface hydrogeologic system. A modeling module can create a three dimensional model of the electric current distribution within the subsurface hydrogeologic system.

DETAILED DESCRIPTION

Figure 1A:
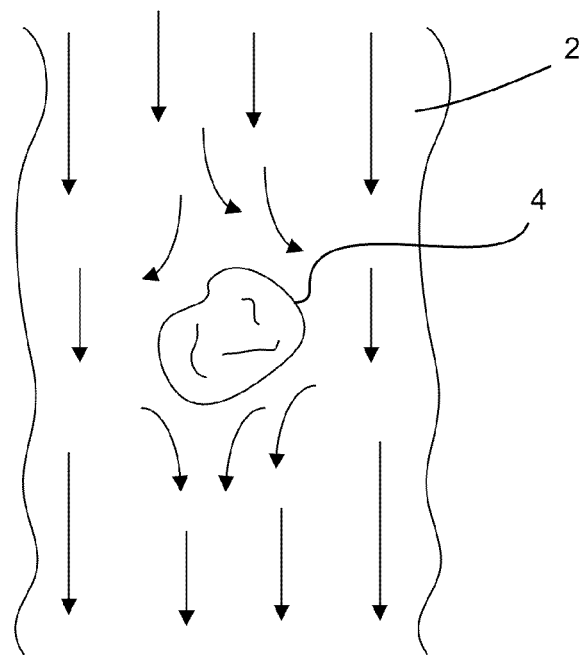
FIGS. 1A-1B are example illustrations for distinguishing variations in current flow in accordance with an embodiment of the present technology.

Reference will now be made to the exemplary embodiments illustrated, and specific language will be used herein to describe the same. It will nevertheless be understood that no limitation of the scope of the technology is thereby intended. Additional features and advantages of the technology will be apparent from the detailed description which follows, taken in conjunction with the accompanying drawings, which together illustrate, by way of example, features of the technology.

While these exemplary embodiments are described in sufficient detail to enable those skilled in the art to practice the technology, it should be understood that other embodiments may be realized and that various changes to the technology may be made without departing from the spirit and scope of the present technology. Thus, the following more detailed description of the embodiments of the present technology is not intended to limit the scope of the technology, as claimed, but is presented for purposes of illustration only and not limitation to describe the features and characteristics of the present technology, to set forth the best mode of operation of the technology, and to sufficiently enable one skilled in the art to practice the technology. Accordingly, the scope of the present technology is to be defined solely by the appended claims.

In describing and claiming the present technology, the following terminology will be used.

As used herein, a "hydrogeologic system" refers to a system or interaction of water with an earthen formation, such as one including at least one of rock, gravel, sand, silt, clay materials and/or any other earthen formation. More specifically, a "hydrogeologic system" can refer to a system with sufficient interconnected porosity and permeability to store or transmit groundwater under the influence of natural hydraulic gradients (commonly referred to as an aquifer).

As used herein, an "electric current distribution" refers to the apportionment, position and/or arrangement of the flow of electric charge through a hydrogeologic system located between electrodes.

As used herein, "channeling" refers to a process that concentrates or constrains a path of a charged flow of fluid through the hydrogeologic system. A "path" or "pathway" can refer to a course that electric charge preferentially follows through the hydrogeologic system.

As used herein, the phrase "discretizing the subsurface" refers to a process of dividing a domain or area into discrete non-overlapping elements that comprise the whole domain or area.

As used herein, a "ratio response" refers to a relationship between a predicted model and observed magnetic field data sets. This relationship identifies areas where electric current distribution in the hydrogeologic system is equivalent to, greater than, or less than the predicted model.

As used herein, the phrase "transport porosity" refers to an ability of an earthen material or formation to conduct water when under pressure or a hydraulic gradient.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

The singular forms "a," "an," and "the" include plural referents unless the context clearly dictates otherwise. Thus, for example, reference to "a rail" includes reference to one or more of such materials and reference to "attaching" refers to one or more such steps.

As used herein with respect to an identified property or circumstance, "substantially" refers to a degree of deviation that is sufficiently small so as to not measurably detract from the identified property or circumstance. The exact degree of deviation allowable may in some cases depend on the specific context.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Any steps recited in any method or process claims may be executed in any order and are not limited to the order presented in the claims. Means-plus-function or step-plus-function limitations will only be employed where for a specific claim limitation all of the following conditions are present in that limitation: a) "means for" or "step for" is expressly recited; and b) a corresponding function is expressly recited. The structure, material or acts that support the means-plus function are expressly recited in the description herein. Accordingly, the scope of the technology should be determined solely by the appended claims and their legal equivalents, rather than by the descriptions and examples given herein.

With the general examples set forth herein, it is noted in the present disclosure that when describing the system, or the related devices or methods, individual or separate descriptions are considered applicable to one other, whether or not explicitly discussed in the context of a particular example or embodiment. For example, in discussing a subsurface hydrogeologic system modeling method per se, other device, system, and/or method embodiments are also included in such discussions, and vice versa.

Furthermore, various modifications and combinations can be derived from the present disclosure and illustrations, and as such, the following figures should not be considered limiting.

Reference will now be made to the exemplary embodiments illustrated, and specific language will be used herein to describe the same. It will nevertheless be understood that no limitation of the scope of the technology is thereby intended. Additional features and advantages of the technology will be apparent from the detailed description which follows, taken in conjunction with the accompanying drawings, which together illustrate, by way of example, features of the technology.

Methods of characterizing and delineating subsurface features have historically involved direct observation or measurement of subsurface properties. Generally, such methodology involves drilling observation wells. Although this approach can be effective, the approach can also be cost-prohibitive and impractical beyond a certain extent. Furthermore, the approach may yield a limited set of data from which broad interpolations and extrapolations are made. Decisions may be made based on interpolations that fail to depict complex and acute changes that occur in the subsurface. To mitigate risk factors involved in making difficult groundwater related decisions, the present technology enables quick and efficient non-invasive location of preferential groundwater flow paths without harming the environment. The present technology can significantly reduce time and expense associated with seepage diagnosis or general groundwater characterization, and can be used in conjunction with monitoring well data and/or other hydrogeologic information.

Some prior systems for evaluating subsurface properties have used electromagnetic signals. However, the present technology is not primarily based on the electric and magnetic fields propagating together in what may be referred to as a "coupled" electromagnetic or EM signal. Rather, according to the present technology, a low frequency electric signal can be transmitted and a magnetic field generated by the electric current flow can be measured. At a low frequency use, the electric and magnetic fields are not coupled (i.e. the electric and magnetic fields do not propagate together as EM, but separately). The present technology can involve injecting an alternating electric current (AC), or direct current (DC) current, directly into the groundwater of interest—often, but not limited to, injection down wells rather than at the surface—and not just at arbitrary locations on the ground, but rather at predetermined locations. An example signal used according to the present technology is a 380 Hz AC signal, though this frequency is not intended to be considered limiting.

The technology described herein can use magnetic fields to map, track, and monitor subsurface aqueous systems, i.e., ground water and related geologic structure. This technology can use the magnetic field produced by a controlled electrical current introduced into the groundwater solution of interest. The electric current can flow in the groundwater conductor, creating a magnetic field around the conductor, which is the groundwater. By monitoring the magnetic fields, the path of the groundwater can be mapped from the surface. The changes that occur in the magnetic fields and how they vary with time can be used to map and monitor activity such as seasonal fluctuations, pumping, in situ leaching, or chemical or biological reactions that are taking place in subsurface solutions. The magnetic field is measured using surface readings. Because this technology directly energizes the target horizon, there is confirmation that the signal being measured is coming from the designated or desired target. An elementary example which demonstrates the principle of how the present technology operates considers what happens when electric current flows in a wire. A magnetic field is produced that circles the wire. The direction and character of magnetic field is defined by the well-known "right hand rule." If a conductive stream of water or solution replaces the wire, electric and magnetic fields will form directly above the water channel. The magnetic field will be horizontal and perpendicular to the conducting zone just as it would be for a wire. This is also true for a curved conductor. The strongest field strength will be measured directly over the conductor. If measured, the magnetic field traces a path on the surface that follows the path of the conductor, i.e., water, in the ground.

Using an electric current flowing through a wire as an example, a magnetic field is created, looping around the wire. In this example, the magnetic field intensity is given by $B=\mu_0 I/2\pi R$, where R is the radial distance from the center of the wire, I is the current in Amps, and $\mu_0$ is the permeability of free space constant, $4\pi \times 10^{-7}$ Tm/A. The magnetic field's direction is given by the right-hand rule: if the wire is grasped with the right hand so that the thumb points in the direction of positive electric current flow, the fingers curl around the wire in the magnetic field direction. Measured differences in magnitude and direction of the magnetic field are used to identify the vertical and horizontal position of subsurface electric current flow. For example, at a point left of the current source both the vertical and horizontal components of a magnetic field are positive (up and to the right, respectively), or rather both have positive polarity. At a point to the right of the current source, the vertical field is negative (downward) while the horizontal component is still positive, resulting in the vertical and horizontal components having opposite polarity. When surveying over a source of concentrated electric current flow, these changes in the vertical and horizontal signals can be observed.

Although the processes of electrical and hydraulic conduction are governed by different principles, electric current flow can be used to qualitatively infer a general distribution of hydraulic conductance in the subsurface.

Hydraulic conductivity is the ability of a material to conduct water when pressure is applied. Hydraulic conductivity is a function of interconnected pore volume (effective porosity—sometimes referred to as transport porosity). The larger and better connected the pore spaces, the greater the hydraulic conductivity and the easier and faster water will flow through the earthen material given a potentiometric gradient.

Electrical conductivity is largely a function of the availability of free ions and the presence of a transporting medium (water) to allow ion movement. Earthen materials commonly act as electrical insulators with electrical conductivities ranging between $10^{-12}$ and $10^{-17}$ mho/m. In-situ measurements of electrical conductivities can range from $10^{-1}$ to $10^{-8}$ mho/m—many orders of magnitude higher. This discrepancy is due to conduction of electrical current by way of ions dissolved in the groundwater. Recognizing that water can generally be a primary facilitator of electric conduction in a typical geologic environment, the present technology efficiently tracks groundwater paths by detecting differences in the magnetic field intensity arising with changes in electrical conductivity.

The present technology naturally works well in environments where the degree of water saturation varies (i.e., between dry and highly saturated areas). However, the technology also works well within a completely saturated environment, relatively dry environments, and anywhere between. When electrical conduction occurs primarily in an open pore space of a saturated matrix, a positive slope correlation exists between electrical and hydraulic conductivities. As a result, hydraulic conductivity can be tracked along higher electrical conductivity zones. When electrical conduction occurs primarily along pore surfaces, such as in wet clay, the positive correlation may disappear and can in fact become a negative correlation. The present technology can provide valuable information by highlighting edges of zones with greater effective porosity, thus revealing pathways where groundwater flows and areas where groundwater does not flow.

Figure 1B:
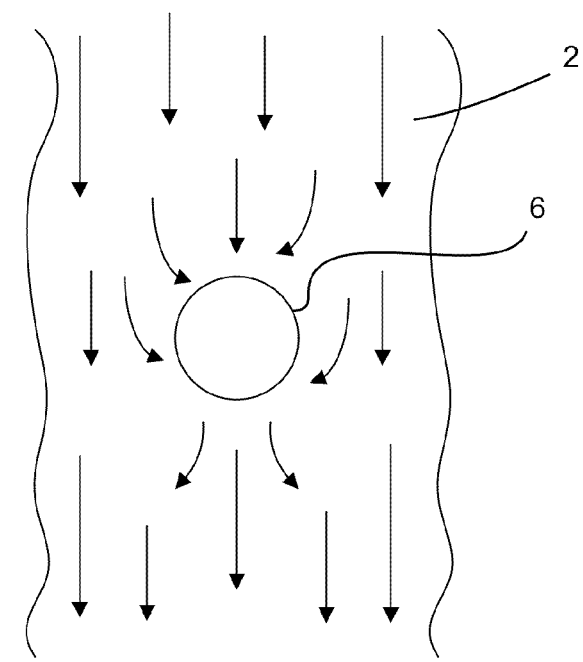

As a further illustration, and with reference to FIG. 1A, consider water 2 flowing around a large boulder 4, such as in a river. Even if the boulder is not observable directly, a shape and location of the boulder is still revealed by the pattern and direction of water flow around it. Electric current flows in much the same way. In an opposite case, as in FIG. 1B, where a large conductive body attracts the electric current flow to the conductive body, the analogy would be similar to water 2 flowing into a submerged drain 6. The anomalous gradient in the water surface would reveal the drain's location, just as an increase in electric current density within a conductive body would reveal the location of the conductive body.

Figure 2:
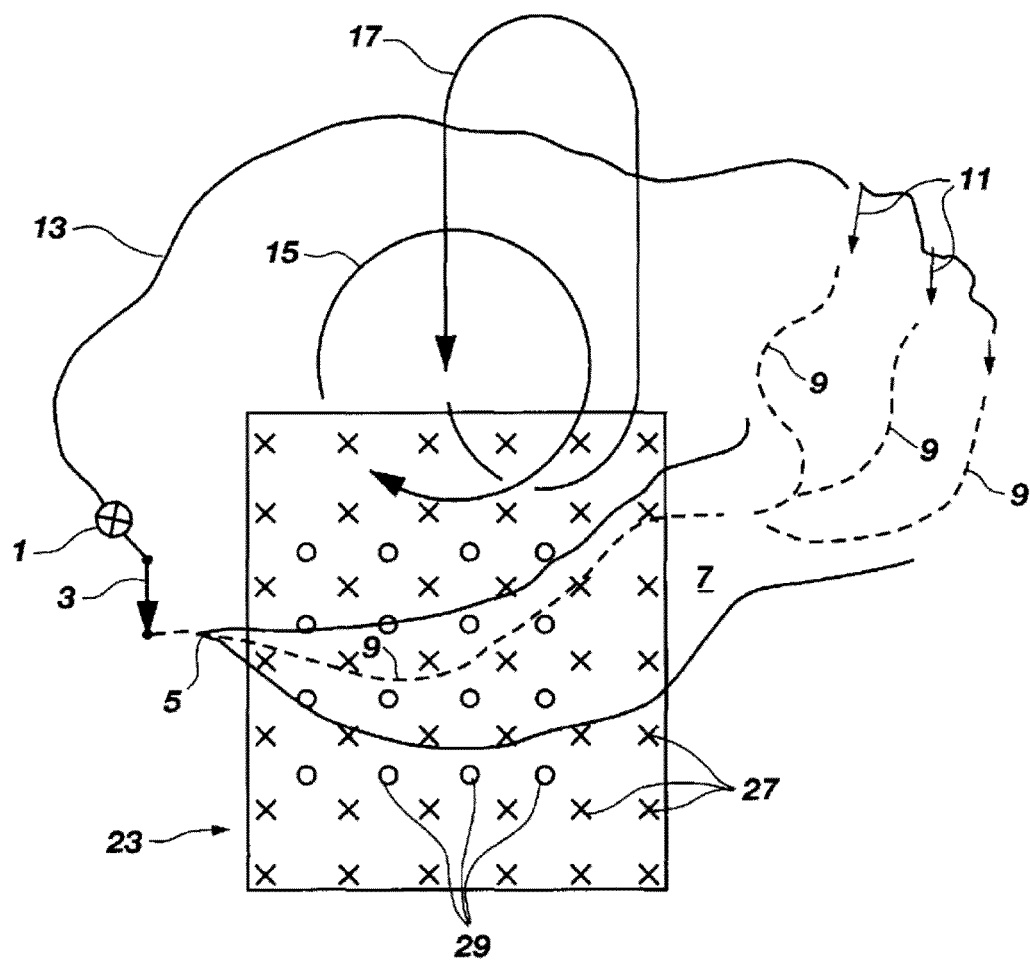
FIG. 2 schematically illustrates a circuit diagram for measuring aqueous systems with surface expressions in accordance with an embodiment of the present technology.

FIG. 2 schematically illustrates the technology for use in measuring an aqueous system with a surface expression. A generator 1 is connected to the energizing electrode 3, which in turn is placed in the seep 5. The seep 5 represents the surface expression of the groundwater 7 (groundwater is also referred to herein as the aqueous system). The groundwater electric current path 9 is shown as a dotted line passing from the seep 5 through the groundwater 7 and returning to the return electrodes 11. The return electrodes 11 are connected to the generator 1 via a connecting wire 13 completing the electric loop. The connecting wire 13 is placed on the surface often far away from the region under investigation. The electrical circuit typically includes instruments for measuring the voltage and current injected and the frequency used to stimulate the aqueous system. Such instruments usually include a voltmeter, ammeter, signal analyzer, etc. Elementary electromagnetic theory teaches that when current flows through a loop of wire 15, magnetic field flux lines 17 will pass through the electric loop in accordance with the familiar right-hand-rule.

Using FIG. 3A as an example (which will be discussed in greater detail below), a horizontal electrode configuration can be implemented to inject electric current into the groundwater of interest. Electrodes can be specifically placed in contact with the groundwater of interest on either side of the study area. A horizontal configuration can establish a predominantly horizontal flow of electric current in the subsurface study area. Furthermore, measurements of magnetic field generated by the current between the electrodes can be taken both on land and water surfaces. For example, measurements may be performed from a boat on the reservoir. The capability of performing measurements on water provides an advantage in delineation of reservoir water seepages. A tie line can be used to stabilize the boat and guide crew members during the magnetic field measuring process.

Further, multiple surveys can be used to investigate seepage flowpaths. Multiple survey configurations can target electric current through specific seeps or regions of the embankment to better delineate individual seepage flowpaths. For example, a first survey may investigate a seepage appearing at a bottom of a spillway in the dam. For this first survey, downstream electrodes may be placed at the end of the spillway in contact with the seepage. In a second survey, electric current may flow through the entire dam to perform a more general investigation of the seepage flowpaths, and electrodes may be centered on the dam near toe drains. In a third survey, electric current may be injected through a small seep in a miter joint to better investigate a source and path thereof through the dam. Each of the surveys or survey areas can overlap to some degree to assist in correlating results between surveys.

To create an electric current flowing in the groundwater, an electrode is placed in the solution to be studied. Groundwater follows paths of least resistance from areas of high potential to areas of low potential through areas of greatest transport porosity. Electrodes can be specifically placed to introduce electric current in the natural direction of the groundwater flow (from up-gradient to down-gradient). In other words, the electrodes can be placed in areas of high and low groundwater or hydraulic potential to optimally create the electric current from the high potential to the low potential and to measure the resulting magnetic field. One part of this technology is that the groundwater or medium of interest is directly energized. Direct energizing of such a target can be accomplished in several ways but ultimately all achieve the same effect. The magnetic signal that is measured at any point in the survey is a compilation of the current flowing in the earth and the field created by the wires leading to the electrodes energizing the groundwater. Some of the various survey configurations are described in the following but are not limited to:

1. Targets that have a surface expression such as a seep, spring, leak in an earthen dam, leaking drain fields, or other surface expressions of subsurface water leaks. This technology requires that the first electrode be placed directly in the seep, spring, or other surface expression to energize directly the concerned fluid. The second electrode can be a single point electrode or a set of electrodes. The second electrode only provides a return path for the energizing current put into the first electrode. A power source providing electrical energy at a predetermined, constant frequency and voltage is connected between the first electrode and at least one ground electrode. There are several ideal types of return conductors like distant fences or other conductors that are running perpendicular to or across the suspected subsurface flow. For a leak in a dam the second set of electrodes is placed in the impounded water. This forms a loop, see FIG. 2.

2. Targets with no surface expression that are located in the subsurface require the use of a well or other previously drilled hole. It is typical for the bottom of the drill hole used for the electrode to be below the target area so that it may be used as the return electrode as well. By placing an electrode in the hole the groundwater of interest can also be directly energized, see FIG. 2. With this condition, the wire leading to the return electrode is not a significant influence. One or more surface electrodes can be used but the influence of the return electrode wire has to be accounted for.

The circuit formed is a large single turn loop consisting of: the electrode in the groundwater, the wire connecting it to a set of return electrodes, the return electrodes, and the groundwater between the electrodes, see FIG. 2. This loop creates the equivalent of a single turn primary coil of an air core transformer. Thus, theory developed for electric and magnetic fields produced by a single turn loop can be used to interpret this data. This technology in particular deals with that portion of the single turn loop that is formed by the completion of the circuit via the groundwater, the grounded portion of the loop. The grounded portion of this loop creates magnetic fields that are controlled by how the groundwater is distributed in the area between the electrodes. The magnetic field strength will be directly proportional to the current in the groundwater and inversely proportional to the distance above the groundwater. Surface measurements made of both the magnetic field strength and the direction of the magnetic field provides information concerning the position, orientation, and conductivity of the groundwater. Magnetic field mapping provides additional information relating to the distribution of the current flowing in the ground water which can be related directly to the subsurface water distribution.

The present technology is based on the concept that electrical current injected into a groundwater source will often follow the groundwater because it is the best conductor. If no other factors influence the electric current, the magnetic field measurements at the surface will be strongest at the point closest to the groundwater generating the field. This permits the tracing of the underground path through the use of surface maps made from measurements at numerous surface locations of the magnetic fields produced by the underground conductor.

Pure water is a relatively poor conductor. However, groundwater and aqueous solutions are seldom pure water and almost always act as the best conductor in the earth's crust. This is due to the presence of dissolved ions either from natural or manmade sources. These could include but are not limited to dumped wastes products, leaking subsurface storage facilities, the creation of acid drainage, chemical reactions occurring subsurface, the injection of in situ leach solutions, or conductivity changes resulting from biological activity.

The technique of this technology can use either direct current (DC) or alternating current (AC) current, with alternating current being a typically implemented current. A constant or pulsed DC current source produces a field that is harder to detect and isolate with available field measuring equipment.

There are some large sources of electrical noise in the ground that should be accounted for when analyzing magnetic field measurements. One source results from power companies which use the earth for their return circuit for all their power distribution. Thus, as usage changes during the day, the electrical and magnetic field produced by the returned electrical power will shift and change the magnetic field produced. These effects are screened by frequency locks between transmitter and receiver and corrections obtained from multiple base stations used to monitor the magnetic fields. Another strong noise source is from telluric currents created by the electrical currents that the sun generates in the ionosphere. Multiple readings at a base station also help eliminate these influences. Another electrical noise source is distant thunder storms. The electrical static generated by lightning strikes becomes trapped in a wave guide between the ground and the ionosphere. Over distance, the currents generated begin to blanket the electromagnetic spectrum usable in this technology. This noise can be corrected using both frequency locks and base station corrections. Frequencies utilized in this technology are selected as ones which are substantially different than any potential interfering or background frequencies.

Water being tracked may be one of several conductors being energized or partially energized. Clay soils often act as a weak conductor producing a broad superimposed field. Nearby power lines or buried cable will produce their own fields and need to be accounted for. The depth of the water from the surface may also vary and will cause variations in the field measurements. Other potential influences include changes in ion concentration, a broadening of the water stream (sheet flow versus channel flow), and even the wire that is used to energize the water stream and connect a return electrode will generate its own magnetic field. Information concerning the physical properties at the site should then be taken into consideration when any study is undertaken and factored into all interpretation of the data.

Analysis or interpretation of the data can be a multifaceted process. Changes in the transmitter electric current, and any changes in the ambient magnetic field intensity, are monitored for the purpose of making corrections to the data. For example, the transmitter current is logged with an ammeter. The fraction of change in electric current over time can be used as a multiplying factor to correct the magnetic field readings for any drift in current. A similar correction can be applied using the magnetic field readings measured continuously at a base station. The anomalies and interpretation can be facilitated and enhanced by the various treatments.

The orientation of the preferred path of electrical current flowing in the ground represents the path of the groundwater or channel. Electric current flows in the same direction as the minimum horizontal magnetic field or perpendicular to the maximum horizontal magnetic field. Electric current flow is also in the direction of the maximum surface electrical field potential or perpendicular to the minimum surface electric field potential. The direction of electric current flow is directly correlatable to the subsurface water channels. The rate of change of the vertical magnetic field intensity across the anomaly is proportional to the width of the current path or indicates the width of the groundwater channel. Width of the horizontal magnetic field anomaly is proportional to depth and width of the channel. Correlation of vertical and horizontal magnetic data is necessary to clarify ambiguities of width and depth.

The magnetic field provides data on the conductivity of the groundwater being tracked. Chemical or biological activity in or near the conducting groundwater will cause local intensity increases in the magnetic field through the production of current carrying ions. The location and number of detection sites affects the quality of the data collected. The sites are typically numerous and closely spaced to generate an encompassing map of data.

As shown in FIG. 2, to collect data, the generator 1, energizing electrode 3, return electrodes 11, and connecting wire 13 are placed on the site under investigation. The generator 1 is generally located far from the energizing electrode 3 to minimize an effect of the generator on magnetic fields to be detected. In this example, the energizing electrode 3 is placed directly into contact with the seep 5. The return electrodes 11 are placed to provide a return path for the current once it leaves the area of interest. In this example, three return electrodes 11 are used. The connecting wire 13 is placed on the ground in such a manner to minimize the effects of its magnetic field on the measurements taken.

FIG. 2 also depicts a grid 23 on regular intervals 27, marked with "X" encompassing the area to be studied. Measurements are then taken at each point on the grid 23 using a receiver shown schematically in FIG. 4. Grid spacing can be arbitrary; however, smaller spacing provides improved definition of the area under investigation. For example grid spacings may be as little as 10 feet or less, or as large as 200 feet or more. In FIG. 2, the initial grid points 27 are marked with an "X". To provide additional definition in a select area it is possible to establish new grid locations 29, such as those marked with an "O" in FIG. 2, and take additional measurements at these points. Measurement station spacing for the grid may depend upon a desired resolution, the target depth, and/or other site conditions. The grid pattern proposed for any particular investigation may be designed to provide sufficient detail and resolution to adequately delineate the groundwater of interest without exceeding budgeted expenses for the investigation.

Figure 3A:
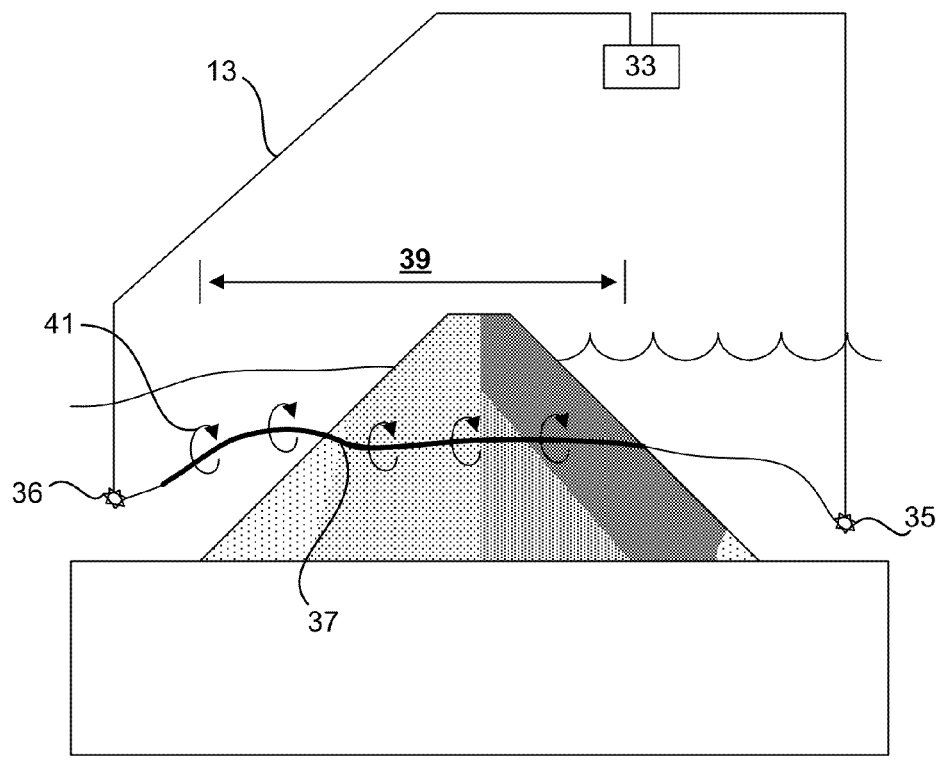
FIGS. 3A-3B are cross-sectional side view block diagrams of monitoring aqueous systems in accordance with embodiments of the present technology.
Figure 3B:
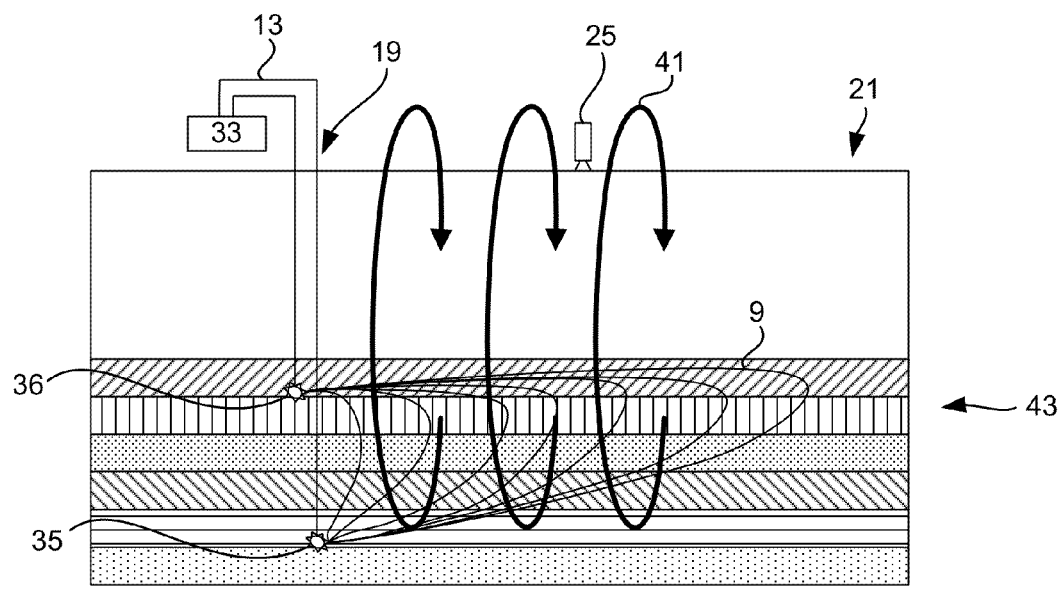

FIGS. 3A-3B illustrate cross-sectional side view implementations of the present technology, similar to the top view illustrated in FIG. 2. For many investigations, a horizontal electrode configuration is employed to inject the electric current into the groundwater of interest, as in FIG. 3A. Electrodes 35 are specifically placed in contact with the groundwater of interest 37 on either side of the study area 39. A horizontal configuration establishes a predominantly horizontal flow of electric current in the subsurface study area, producing an orthogonally oriented magnetic field 41.

Referring to FIG. 3B, for some investigations, a vertical electrode configuration is more appropriate, such as when mapping a contamination plume's growth from a central source. This configuration can also be utilized to reduce interference from surface culture, such as metal pipes, power grid grounding wires, railroad tracks, steel fences, and so forth. For optimal results in this configuration, the presence of a relatively resistive layer between the upper and lower electrodes can cause electric current to spread out sufficiently from the upper electrode to obtain a sufficient number of measurements from the surface to accurately identify preferential groundwater flow paths.

In FIG. 3B, a power supply 33, such as a generator, is connected to the energizing electrode 35 which energizes groundwater within the subsurface 43 at the target horizon or depth. The energizing electrode 35 and return electrode 36 are located in a well 19. The electric current path 9 is represented by the lines passing through the groundwater and subsurface to the return electrode 36 at a point below the groundwater. Conceptually, it would also be possible for the return electrode 36 to be above the target horizon instead of below. The electric current loop is completed by connecting the generator 33 to the return electrode 36 by a connecting wire 13 through the well 19. Again, the magnetic field loop 41 will pass through the electric current loop, allowing measurement on the surface 21 using a receiver 25.

Figure 4:
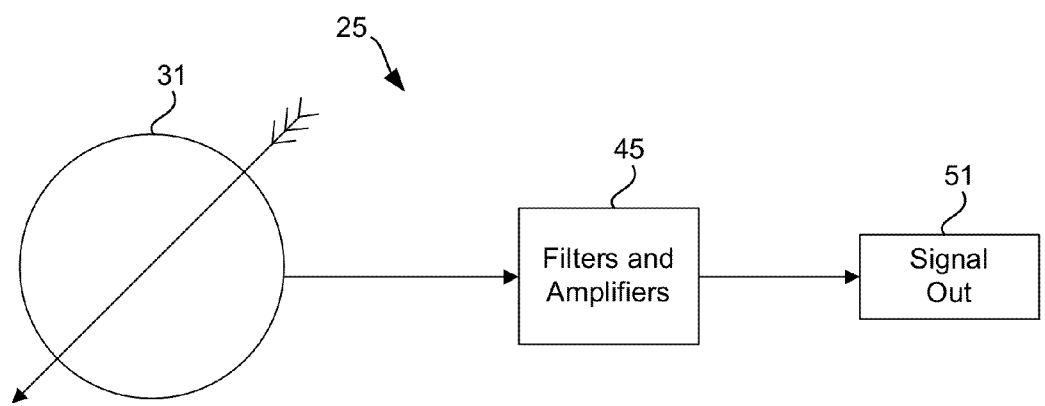
FIG. 4 is a block diagram of instrumentation used to measure a magnetic field in accordance with an embodiment of the present technology.

FIG. 4 is a block diagram of the receiver 25 used to measure the magnetic field at each of the grid points 27 or 29 of FIG. 2. The receiver 25 consists of a detecting coil 31 and filtering and amplifying circuitry 45, which work together to produce a signal 51 representing the magnetic field intensity measured by voltage. These circuit components are merely representative of electronics necessary to measure a magnetic field indirectly through the current induced in a detecting coil. The sensitivity of the detecting coil can be increased by multiple loops of wire in the detecting coil.

Figure 5:
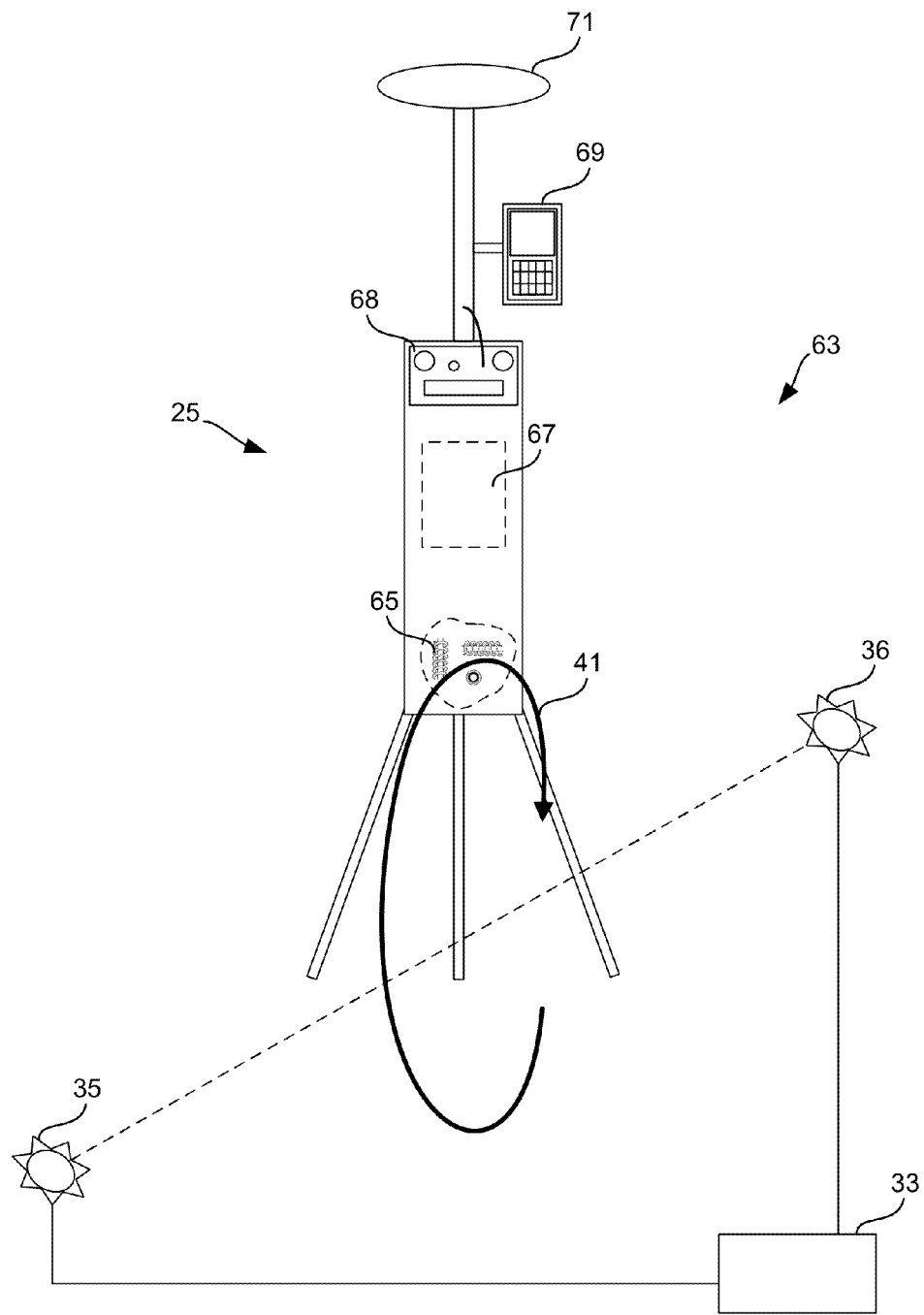
FIG. 5 is a schematic illustration of a monitoring system, including a receiver, in accordance with an embodiment of the present technology.

Referring to FIG. 5, an apparatus 63 for energizing a subsurface aqueous system and measuring resultant magnetic fields emanating from the energized subsurface aqueous system for use in mapping and monitoring the aqueous system. The system may include a transmitter/generator capable of generating an electrical signal, often of a preselected frequency, a primary energizing electrode in contact with the aqueous system, an electrical conductor connecting the transmitter to a primary electrode 35, at least one secondary return electrode 36, a subsurface aqueous solution located between the primary and the secondary return electrode, an electrical conductor 13 connecting the at least one secondary return electrode to the transmitter, at least one receiver 25 capable of measuring the magnetic field emanating from the aqueous system when the transmitter is activated to generate an electrical current to impose a voltage upon the aqueous system, and a signal process to process and record measured data.

The receiver 25 to measure magnetic field may typically include one or more coils 65 to generate an electric current when magnetic field flux 41 passes within the coil, a mechanism to level the coil, a mechanism to move the coil between horizontal and vertical positions, a mechanism to rotate the coil in either the horizontal position or the vertical position, and a device to measure compass coordinates of the coil, such as a GPS device 67/GPS antenna 71, and, often additionally, an electric dipole attached to a voltage measuring device, and a means for orienting and measuring the dipole in any direction on the ground to measure the magnetic field.

A typical signal processor, such as in a portable computing device 69, useful in this technology can include filter circuitry to exclude undesired frequency components from the field signals, amplification circuitry to amplify processed signals, and memory storage to record measured data and processed data. The GPS unit, a data logger, circuit boards, and so forth are represented together by box 67. The receiver can further include a control panel 68 to enable a user to interface with and manipulate the receiver.

Structurally, a receiver to measure magnetic fields detected according to the technology can include a horizontal coil to generate electric current when magnetic field flux passes within the horizontal coil, a vertical coil to generate electric current when magnetic field flux passes within the vertical coil, a mechanism to level the horizontal coil, and a mechanism to level the vertical coil a mechanism to rotate the receiver can further include a horizontal coil about a horizontal axis, a mechanism to rotate the vertical coil about a vertical axis, a mechanism to measure the angular direction of the coils, and a device to measure compass coordinates of the receiver. The components can also be in a sophisticated arrangement and may include three coils in fixed orthogonal relative orientation, a mechanism to level the fixed three coils, a mechanism to orient and measure the angular coordinates of the fixed three coils, and a device to measure compass coordinates of the receiver.

The coils utilized in the practice of this technology can be very sensitive to small amounts of magnetic fields. Typical coils have thousands of turns of wire about the central core, which is typically a ferromagnetic material.

A transmitter is typically one capable of generating an electrical signal of one or multiple preselected frequencies and capable of generating an electrical signal varying with an ideal current of 0.1 to 2.0 amps, which may use a voltage of 0.1 to 1000 volts. In a more specific example, the voltage may be from 0.2 to 300 volts. While these ranges may be useful for many applications of the present technology, the ranges may also be higher or lower based on site specific conditions.

The receiver measures subtle changes in the magnetic field associated with subsurface electric current flow and is capable of detecting the magnetic field produced by $1/10$th of an amp of current from up to one mile away. The receiver can be attached to a surveyor's pole and hand-carried to each measurement station or placed on a mobile platform.

The magnetic coils can have a high-inductance and compact design. The inductance of each coil can be approximately 60 henries. The size of each coil may be approximately 5.7 cm in length and 3.8 cm in diameter.

Signals from the coils can be amplified, filtered, and digitized by a datalogger. The datalogger can be programmed to calculate spectra and stack them to reduce incoherent noise like spherics and other short-lived events. A processor can calculate a margin of error and stack more or less data to improve the precision of the measurement. Measurements can be statistically analyzed and repeated until the measurements fall within an acceptable deviation (such as within 5% or less, for example). A warning may be issued by the instrument if the signal strength is too low. A measurement and data processing process may take up to ½ to 5 seconds per station or location to measure and calculate the magnetic field strength at 380 Hz. The 380-Hz signal is not a harmonic of the 60-Hz used in the United States or 50-Hz power used in Europe, Asia, and Africa, and can thus be relatively easily distinguished from signal noise which may also be detected.

A signal processor useful in the apparatus of this technology may comprise a computer with a processor and memory, and computer readable instructions which, when executed by the processor can be used to filter, amplify, display, and record the measured signals, the angular coil coordinates and the measured receiver compass coordinates.

The present technology can use a controlled source to inject electrical current into the groundwater of interest. A specific signature frequency can be used to avoid the harmonics of the power frequencies that are in common use around the world, as discussed above, and to more easily distinguish the signal from any other noise or signals which may be detected. According to the Biot-Savart Law—which describes how magnetic fields are generated by electric currents—the distribution of subsurface electric current flow can be mapped by carefully measuring the magnetic field.

A raw horizontal magnetic field contour map—or "footprint" map—can be used to identify the horizontal position of electric current distribution beneath the study area. A vertical position (depth) of fluid can be determined by further processing and modeling. The initial footprint map reveals anomalous areas of high and low electric current flow beneath the study area.

To monitor a site over time, measurements can be repeated at regular intervals, such as every two weeks or every two months, and the data then compared. Comparing the changes in the various components of magnetic fields over time provides information relating to fluid movement, changes in chemical activity, changes of fluid in an aquifer, changes in subsurface biological activity, movement of chemical or bio-reaction fronts, leaching progress and activity relating to in situ mining, progress of subsurface chemical or biological remediation, increases or decrease in subsurface flow, changes in salinity, or any change in the groundwater that affects any of its electrical properties. The field intensity readings are mathematically normalized for distance from the energizing electrode. As current flows down the groundwater channel, some electrical current leaks into the surrounding medium. The magnetic field contrast between the channel and host rock can be evaluated by the rate at which the magnetic fields degrade. Data can be enhanced using distance correction factors. These correction factors are generally used in a series but could be used individually. The corrections generally follow a pattern similar to but not limited by, the fourth root of the distance, the cube root of the distance, the square root of the distance, the distance, the square of the distance, the cube of the distance, the fourth power of the distance, etc.

For example, the most common corrections for dispersal of current can be expressed as one of a series of equations $$I_{channel} = C \frac{I_{injected}}{L^n} \frac{\rho_{channel}}{\rho_{surroundingmedia}}$$

where C is a constant of proportionality, $I_{channel}$ is the current in the channel, $I_{injected}$ is the current inserted at the transmitting electrode, L is the length along the channel from the energizing electrode, n=1/k, or n=k, where k is a positive integer, $\rho_{channel}$ is the resistivity in the conducting channel, and $\rho_{surroundingmedia}$ is the resistivity of the surrounding rock or soil.

When using a series such as this, the anomalies will eventually reverse. The point of reversal is related to the dispersion of current between the groundwater channel and the surrounding media. The dip of the magnetic field is related to depth and dispersion of the ground current. Crossed electric and magnetic field gradients are related to subsurface reaction zones. Interpretation can also be facilitated by plotting the data as profiles.

There are essentially an infinite number of potential data variations that might be interpreted. The following are representative examples of how the most common features will appear when site data is plotted in a manner similar to that of a contour map:

1. A non perturbed field, where no conductor is energized, typically forms a contour map composed of concentric circles around the point where the water is energized.
2. Water in a narrow channel will form a V shape in the contours. The gradient will be steeper the closer to the surface the channel is.
3. A vertical structure such as water flowing along a vertical fault, will also form a V-shaped contour but with a somewhat lower gradient as fields generated at depth extent of the fault structure will add to the electrical currents closer to the surface. This V shape can be sharp or subtle.
4. A flat conductor or sheet flow of water will produce a different signal. The gradient will increase toward the edge of the water then level off, only to reduce sharply on the other side. These gradients are different but could be confused with the gradual decreases in signal strength resulting from increasing distance from the energizing point. Increasing distance from the energizing point is caused by current bleeding from the conductor and finding an alternate path to the return electrode.
5. A profile of a deep narrow conductor will look very similar to a flat conductor except that the contour at the edge of a shallow flat or sheet conductor will be much more pronounced.
6. Up welling along a conductor will start with lower values due to the depth of the initial flow, then increase and narrow in the area of the up welling.
7. Branching in a conductor may show very misleading results in the area of the branch as two or more fields will be measured at one time.
8. If the water becomes less conductive or if the thickness of the water layer thins, such an area will show lower field strength as less current is carried. An example of such a situation is one where relatively fresh water passes through a reaction zone and picks up additional minerals. Measured from the high conductivity side to the low conductivity side, there will appear to be a rapid decrease in conductivity.

9. Conductors in surrounding rock or soils, even weakly conductive soils, may cause distortions in the fields measured and may even form secondary fields. A clay lens near the studied conductor, such as a landfill lining, will tend to mask the field of the conductor being tracked and could produce localized high readings in wet areas as such a lens will act as a good conductor.
10. Fields in the area of a return electrode generally show higher values inasmuch as the current is collected and concentrated at the electrodes no matter which path it has taken.
11. A study conducted over time, weeks or months, will typically show changes in field values at the same location due to changes in the flow of water, chemical changes over time (such as oxidation or acid production), or biological activity. Variations from one season to the next are to be expected due to variations in seasonal water flows.

Measured magnetic fields are used to construct a model of the electrical current flow in the ground resulting from the current introduced at the energizing electrode. The resulting electrical model can then be used to determine the groundwater configuration being energized. Data and resulting maps can be evaluated by an interpreter to locate the track and activity of the subsurface solution being monitored.

When using the present technology to monitor activity such as movement, chemistry changes, or bioactivity, establishment of a reference survey can be useful. This reference survey can be a base to which all subsequent surveys may be compared. The difference between the fields measured for the separate surveys are used to evaluate and determine the extent and magnitude of subsurface changes in the conducting solution under observation. This aspect of the present technology can be used, for example, to:
1. Track tracers (i.e., salt) solution injected in wells.
2. Monitor subsurface chemical reactions by monitoring the change in ion concentration via changes in the magnetic field.
3. Where in situ leaching solutions are in use, permanent stations are established to track the reaction front, movement of the underground fluids, or areas where the solution intersects a non reactive area. For such an activity, constant monitoring may be required.
4. Biological reactions can be monitored because they affect the number of ions in the solution.

Implementation of these applications will change the flow of current in the subsurface and will result in changes in the magnetic fields measured at the surface. Changes in the magnetic field thus correlate directly to changes in the study area.

Following are some examples of how the present technology can be used in various subsurface water monitoring applications. These are presented as non-limiting examples and are not intended to cover all situations involved in tracking groundwater.

1. Groundwater, Follow Groundwater Channels, Maps Groundwater Structures

This is the foundation technology upon which all the following applications are built. Electrical energy is injected into the groundwater of interest. The magnetic fields generated by that injected current are monitored, measured and used to map its course from the surface.

2. Track and Monitor Subsurface Pollution Plumes

An electrode is placed in the contaminated plume, and electrical energy is injected. The magnetic fields generated by the contaminated plume are used to map the plume and identify any branches that might go undetected by a systematic drilling program.

3. Locate the Source and Feeder System of Springs or Seeps

An electrode is placed in the seep or spring. A wire is extended from the injection electrode to return electrodes in the suspected path of the water. This wire, the electrodes, and the water, form a conducting loop. Stations are measured along selected profiles. The primary parameter of interest for this type of survey is the horizontal magnetic field measurement which is determined by measuring the current generated at a receiving station by magnetic field flux lines passing through a single or multiple turn coil. The data are corrected for drift, distance, and current variations. Interpretation involves three types of data: (1) contours of corrected horizontal magnetic field, (2) profiles of the horizontal magnetic field, and (3) vectors of the minimum horizontal magnetic field.

4. Map Interconnected Fracture or Porous Zones

Place an electrode in one zone and the return electrode in the second. By mapping the surface magnetic fields the interconnection of water between the two zones can be identified, and mapped on the surface. Variations in the contour of the surface map of the magnetic field will give an indication of variations in the depth or shape of the fracture or zone surveyed.

5. Maps or Trace the Path of Leaks in Earthen Dams, Maps Leaks in Drain Fields

For a dam the leak is energized. The reservoir is used as the return electrode. The current will follow the water in the earthen dam back to the water in the impounded area. Thus, the path of the leak is illuminated and mapped by the resulting magnetic fields.

For a drain field an electrode is placed in direct contact with the water emanating from the drain. The placement of multiple return electrodes surrounding the drain field allows the electrical current to find the best path through the drain field, which will be the water's path, to complete the electrical circuit or loop. The wire used to connect the return electrode is run as far from the area of investigation as possible to minimize the effect of its field on the study. The survey is conducted over the area covered by the drain field. Drains with water in them will be energized, and dry drain pipes will not conduct electricity so they will not be energized. Measurement of the magnetic field will map the conducting (wet) drains.

6. Monitor Changes in Subsurface Water Flow, Monitor Movement and Changes in Subsurface Solutions This technology will monitor the depression cone created by pumping subsurface water yielding information on the lateral extent of draw down. The dispersion cone decreases the volume of the electrical conductor in the area, decreasing its ability to conduct electricity as well resulting in a decrease in the magnetic field. The replenishment of the cone results in a subsequent increase in nearby magnetic fields. By following the decrease or increase in magnetic field it is possible to track and monitor the movement of the depression cone. Changes in the magnetic field can also be used to detect the direction of flow that replenishes the depression cone.

7. Monitor Changes in Ion Concentration in Groundwater, Monitor In Situ Leaching Solution, Monitor Solution Pathways in Heap Leaching Operations This technology can monitor changes in groundwater such as changes in volume over time or changes in conductivity due to factors such as increased dissolved solids or dilution. By directly charging the fluids involved and measuring the magnetic field changes as they occur, this technology can be used to accurately track the progression of solutions or reactions as they move and spread in the subsurface. Measurements using this technology are dynamic and can be conducted whenever observations are necessary to detect possible changes in the subsurface flow or concentration.

In situ mining such as solution mining is a promising and potentially environmentally-benign technology for mining metals. The technology involves the injection of leaching solutions into an ore zone at an injection well and then recovering loaded solution through recovery at production wells. It is generally assumed that all the leaching solutions injected will be recovered by withdrawing more solution, i.e., injected solution plus groundwater, than is injected. Another assumption is that sufficient information about the fracture pattern can be collected by an extensive drilling program to predict flow in the leach zone. Drilling could miss fracture zones or other porous zones within the ore body. The present technology can locate fracture zones or other structures that could interfere or alter the flow of leaching solutions. The present technology permits monitoring of all changes that occur during the leaching process, provides the ability to monitor the movement of solutions through the fractured ore zones, and validates the assumption that all injected solutions can be recovered and none will escape. The present technology permits improved monitoring of the solution and allows the detection of stray fluid streams before they become a problem, as well as making it possible to determine the need to drill any intercept or additional collection holes required to prevent leach solutions from reaching areas surrounding the intended leach zone.

The present technology further makes it possible to map the progress and course of leaching solutions in a heap leach mining operation. The process is very similar to that described for monitoring in situ leaching.

8. Monitor Changes in Subsurface Redox or Reaction Fronts, Monitor Underground Chemical Reactions As chemical reactions occur underground the number of ions in solution changes. This will increase or decrease the conductivity of the groundwater. These changes can be used to detect where acid is being generated in underground locations and how active the process is. This can be used to monitor chemical reactions such as heap or in situ leaching, contaminate remediation, or biological reactions.

9. Monitor Subterranean Bioreaction

Bioreactions will affect and change the ion content of groundwater or other involved solutions. These changes are monitored via the variations that occur in the magnetic fields. Monitoring of underground bioactivity can be used to observe the effectiveness and extent of microbes that are being used to clean up underground pollution. This technology enables monitoring the mobilization of underground substances or the changes that occur in compounds during subsurface bioremediation.

10. Subsurface Waters and Related Geologic Structures

The mapping of related geologic structures is a byproduct of mapping the location of groundwater. Structures which effect where subsurface water can or cannot move can be inferred from how groundwater is distributed. Various criteria can be used to determine the quality of the magnetic field data measured and recorded by the a receiver (i.e., the magnetic field detection device). Some examples may include:

1. Circuit continuity between electrodes;
2. Signal-to-noise ratios; and
3. Signal repeatability Circuit Continuity As described above, a magnetic field is created by a large electric circuit comprising (1) the power supply, (2) the circuit wire, (3) the electrodes, and (4) the subsurface study area between the strategically placed electrodes. Circuit continuity refers to whether or not an electric current—and how much electrical current—can be driven through the subsurface study area from the given points of coupling with the earth (electrodes). Depending on the size of the study area and depth of investigation, a low level of electric current may be sufficient to generate a strong enough signal for a survey. In the case where too little or no electric current flow can be driven between electrodes, the setup has "poor continuity," and an alternate location may be found for one or both electrodes.

Signal-to-Noise Ratio

"Signal to noise ratio" refers to a ratio of the signal to the mean ambient field noise, which is determined from a sampling of other non-harmonic frequencies in the spectrum. This signal to noise ratio can be computed for each measurement and can be used to help indicate the data reliability.

Signal-to-noise ratios can be monitored continuously to ensure adequate signal strength. If the signal-to-noise ratio falls below a specified value, the data may be considered unreliable. Low signal-to-noise ratios in a particular area typically indicate one or more of the following conditions:

1. There is no conductive media in the study area for the electrical current to concentrate or follow;
2. The area of low signal-to-noise is partially isolated, limiting electric current flow; and
3. The electric current flow is highly dispersed throughout the study area and is not concentrating in any one particular area or pathway.

Considering the vastly different possibilities of geologic, electrical and hydrologic conditions, every application may be unique. Therefore a challenge of every survey may be to establish electric current flow that will follow and stay focused in the targeted study area. Signal-to-noise maps show where the signal strength stands well above the background noise. If the signal-to-noise criteria is not met, then it can generally be inferred either that: (1) the study area lacks preferential flow paths, or (2) a different electrode configuration needs to be employed to better bias electric current flow through the area of interest.

A signal-to-noise ratio can be computed for each measurement as the ratio of the signal at 380 Hz to the mean ambient field noise, which can be determined from a sampling of other nonharmonic frequencies around 380 Hz, for example. The signal-to-noise value can be contoured and presented for each survey to help assess the degree of data reliability.

Figure 6A:
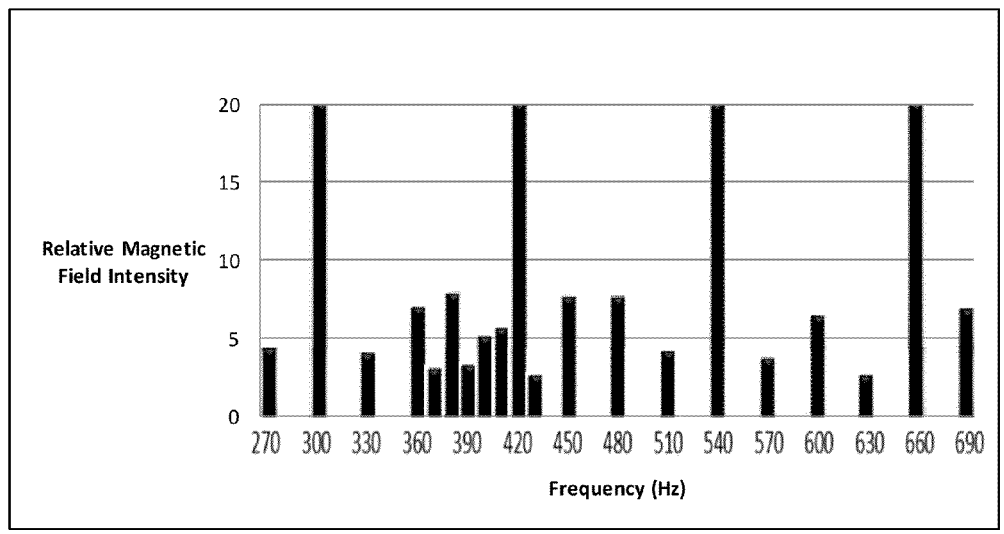
FIGS. 6A-6D graphically illustrate signal to noise ratio data in accordance with embodiments of the present technology.
Figure 6B:
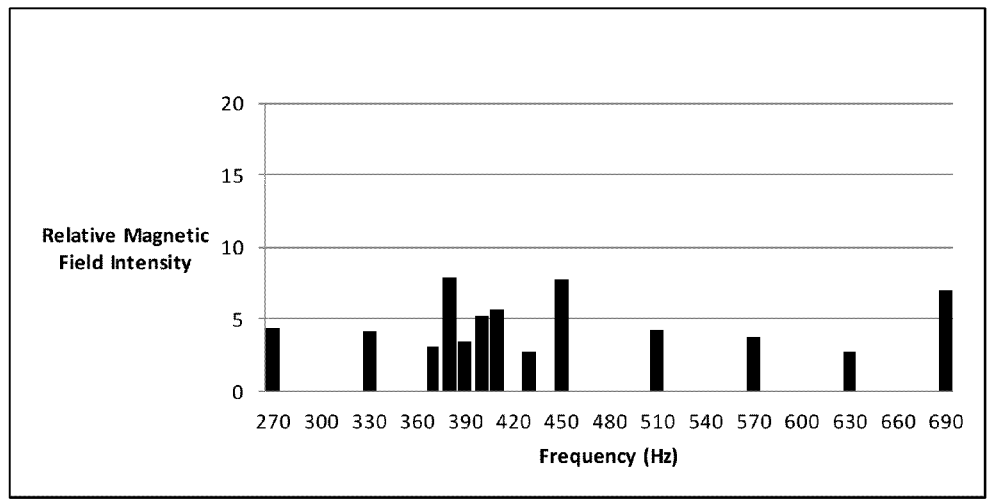
Figure 6C:
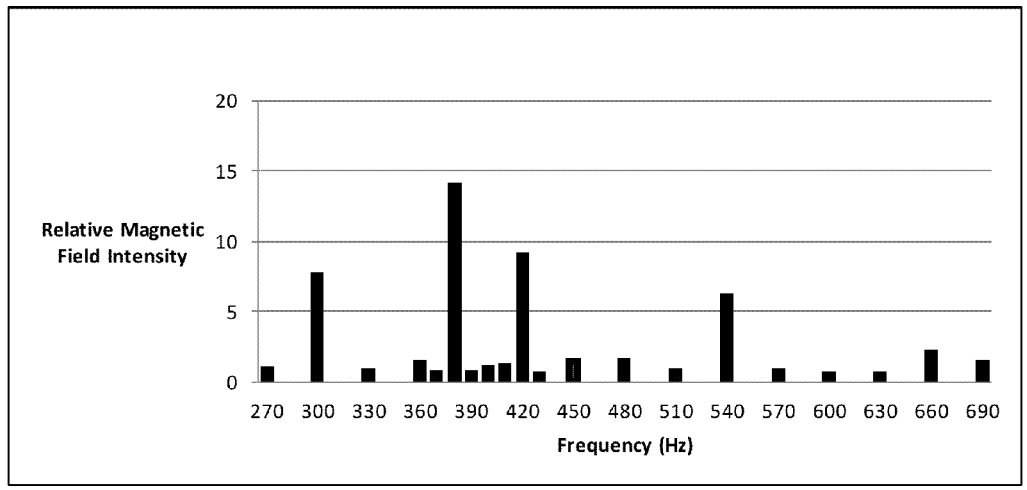
Figure 6D:
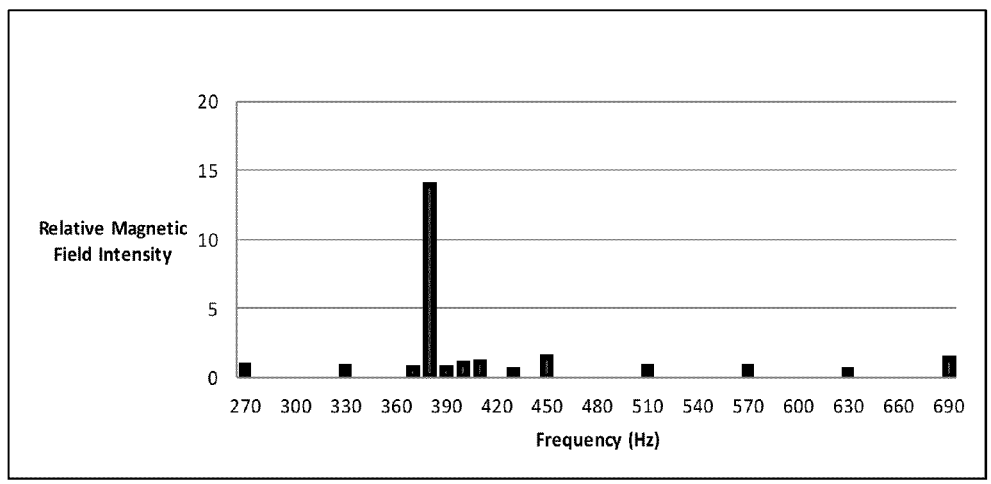

With reference to FIGS. 6A-6D, the illustrated bar charts can demonstrate the value of improving the signal to noise ratio for accurately identifying the signal. FIG. 6A illustrates a measurement of a signal with a noise spectrum and 60 Hz power harmonics. Without further information, the signal may be difficult to identify. In FIG. 6B, the power harmonics are removed from consideration, but the noise spectrum still obscures the signal. FIGS. 6A-6B illustrate examples of a poor signal to noise ratio. In contrast, FIGS. 6C-6D illustrate examples of a good signal to noise ratio. In FIG. 6C, a signal and power harmonics are clearly distinguishable from a noise spectrum. In FIG. 6D, the power harmonics of FIG. 6C have been removed, leaving a strong relative magnetic field intensity identifying the signal of interest.

After the magnetic field is measured, the data can be sent to a computing device and merged with GPS data. Field crew members can check an initial quality of the reading and provide any additional information about the measurement, such as the type of reading, local coordinates, and notes regarding geology and culture. Sensitivities of instruments used on any particular project may vary slightly. To account for instrument differences, each instrument takes measurements at the same position, such as at a base station established within the survey area, numerous times throughout the course of the survey. The mean of each instrument's base readings can be compared to the static base and the other field instruments, allowing for slight adjustments to be made that effectively normalize the instruments.

At the base station, a static receiver can log the magnetic field continuously, throughout the day. The static receiver can be used to understand and correct for any variability in the magnetic field. In addition to logging the magnetic field, the power supply current can be logged and used to correct for any drift in the magnetic field data due to electrical current fluctuations.

Signal Repeatability

Repeatability is determined from base station and field instrument readings taken throughout the course of the fieldwork. Repeatability tests can be performed frequently to ensure proper calibration and performance of field equipment.

Data Normalization and Reduction

The analysis of magnetic field data may involve reduction of the data, modeling, and/or interpretation of the data. The data may be subject to a number of comparisons and corrections to account for: possible differences between instruments used in the investigation; transmitter current drift or diurnal magnetic drift related to ionosphere activity, etc.; ground noises or man-made interferences (power grid grounding wires and other long continuous conductors including metal pipelines, railroad tracks, steel fence lines, etc.); and effects of the electric current bias (electrode and circuit wire locations).

Drift Correction

Figure 7:
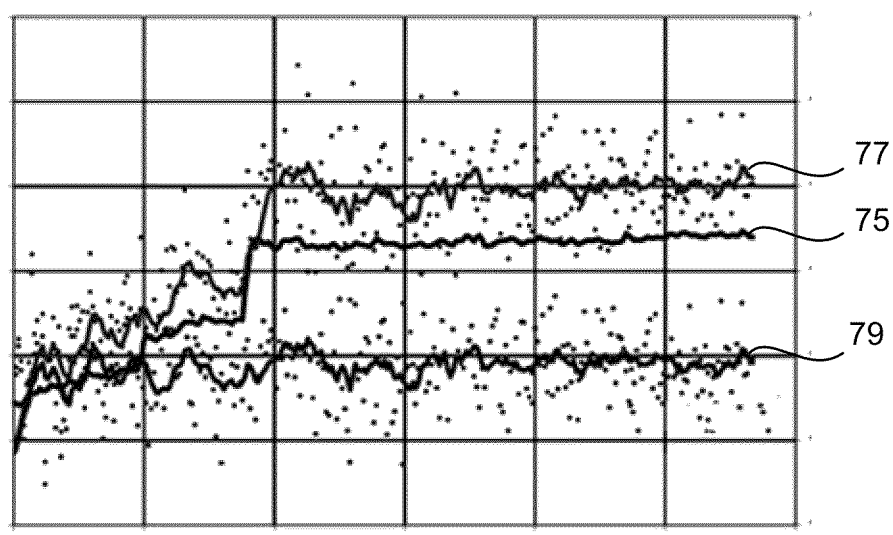
FIG. 7 is a graph of current drift correction applied to a static monitoring receiver in accordance with an embodiment of the present technology.

During a survey, the magnetic field amplitude may drift slightly over time. The largest source of drift is usually the transmitter current, given that the earth-circuit resistance can vary to some degree. The transmitter current can be logged continuously throughout the day. The variation in the electric current may typically be small, but in some locations, such as where water levels are changing for example, the transmitter current may fluctuate by up to 10% or more. To correct for drift caused by the transmitter current, the mean of the current can be normalized to 1 and a correction factor can be calculated for any deviation from the mean. This correction can be applied to the magnetic field data collected over the course of the survey. FIG. 7 illustrates a current 75, with drift over time, as well as a trend line for raw data 77, and a trend line for corrected data 79. In this figure, the measured drift of the electric current is used as a basis by which to correct the raw data to obtain the corrected data.

To ensure that sources other than the transmitter's electric current source are not causes of magnetic field drift, a static receiver can also monitor the magnetic field at the base station. This magnetic field log can then be used to correct for any residual drift that may occur. The residual drift variations may be less frequently encountered as compared with transmitter current drift, for example, and may occur due to extraneous natural or man-made sources.

Correction for Electric Current Bias, Circuit Wire, and Conductive Culture

When analyzing, interpreting and/or modeling magnetic field data, some of the strongest influences on electric current flow through the subsurface are: groundwater and surrounding materials; conductive cultural features such as underground pipes or wires; and electric current bias (i.e., electrode placement).

The present technology utilizes the principle that a signature electric current may be strongly influenced by the presence of groundwater or areas of greatest transport porosity where groundwater accumulates and/or flows relatively freely through the subsurface. In settings when the electrodes are placed properly, the electrical current will naturally gather and concentrate in areas or pathways of higher conductivity.

The magnetic field may be influenced by near-surface conductive man-made culture, such as metal pipelines, power system grounding wires, steel fence lines, railroad tracks or other long continuous conductors. Culture is not always present, but can be a factor and may even be problematic by causing large anomalies that overshadow the magnetic signal generated from subsurface electric current flow. Therefore, when surveying an area with conductive culture, it may be desirable to identify the conductive features before a survey is initiated and strategically design the survey to avoid any long conductive features to the extent possible. Because conductive features sometimes exist within a study area, avoiding conductive culture can be difficult. Fortunately, the locations of many of these features may be known. Therefore, the influence of cultural conductors can be removed and/or taken into account when interpreting the data.

The magnetic field in any given survey is subject to electrical current bias because of the placement and position of electrodes and circuit wire. Electric current travels from one electrode to the other to complete a circuit. Therefore, the electrodes and circuit wire are a source of extraneous magnetic fields. Because 100% of the electric current flows through the circuit wire and concentrate in and out of the points of coupling (i.e., the electrodes), the magnetic field tends to be stronger near the electrodes.

To properly interpret the magnetic field data, it is typical that these influences be identified and considered or corrected for. For example, finite element computer codes may be used which predict the electric current flow and resulting magnetic field model for the given terrain and survey setup based on a homogeneous subsurface scenario. Magnetic field effects from the circuit wire, and in some cases from conductive cultural features, can also be predicted. Once the effects from the electric current bias, the circuit wire, and any conductive culture are removed, as will be described in greater detail below, the data more easily reveals electric current flow patterns and determination of groundwater flow based on the distribution of electric current beneath the study area is made easier.

In interpreting the data, the following rules can be applied. Directly above the electric current, the horizontal magnetic field component reaches maximum, while the vertical (z) component is zero. The horizontal component is perpendicular to the line electric current. Horizontally adjacent to the line current, the horizontal magnetic field component is zero, and the vertical (z) component is maximum and changes direction from one side to the other. The derivative of the vertical magnetic field (dHz/dx) is proportional to the width of the electric current flow. Width of the horizontal magnetic field intensity is proportional to depth and width of the electric current. Correlation of vertical and horizontal component data can be used to clarify ambiguities of width and depth.

In this simplest case, the magnitude of the horizontal x-y component will locate the electric current and the vector direction will help determine the electric current orientation. The z-component, although less helpful due to the observation points being confined to the space above the ground surface (always above the electric current sources), can aid the determination of the depth and size of the electric current.

Stray electric current flowing onto near-surface conductive culture can be problematic for interpreting electric current flow at a depth. As a result, removal of near-surface interference can be used in order to properly interpret the distribution of electric current flow in the subsurface. Near-surface interferences may be identified by various criteria, such as: a normalized gradient filter, a distance from culture, and point-specific professional judgment.

Figure 8:
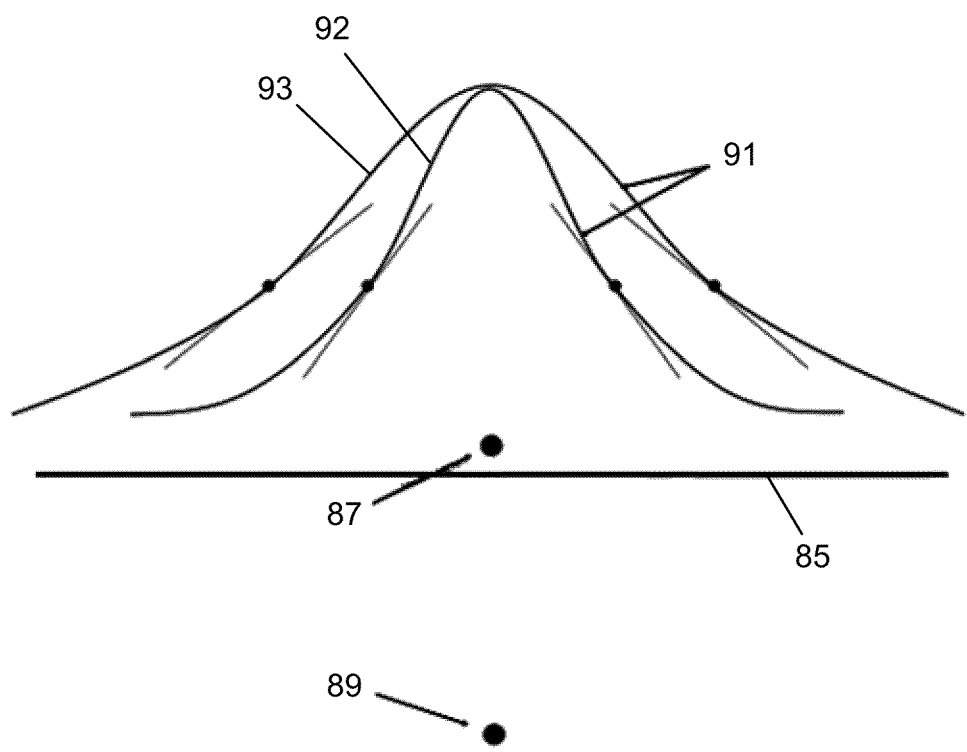
FIG. 8 is a graph of a normalized gradient filter in accordance with an embodiment of the present technology.

An analysis of magnetic field gradients is one way to separate signals caused by near-surface conductors from signals that originate at depth. In FIG. 8, both shallow/overhead 87 and deep conductors 89 are represented by energized wires running perpendicular to the page through the points shown. The curves 91 show the horizontal magnetic field measured at ground level for the corresponding wires. FIG. 8 demonstrates that near-surface or shallow conductors 87 cause anomalies 92 having much steeper slopes or higher gradients than anomalies 93 from signals originating from depth 89. Measurement stations influenced by electric current flowing on near-surface or above ground conductive culture can be identified and removed from the data set using magnetic field gradient cutoff criteria.

Although the gradient filter method is effective, this method may not separate out all cultural influences. Steep gradients can occur over very short distances and can sometimes pass detection due to discrete station spacing, particularly where the grid is sparse or near survey edges. Also, while near-surface electric currents may be much weaker than those at depth, such currents can still influence readings within a close proximity—potentially closer proximity than a typical station or measurement spacing. Such an influence may be significant even without causing a measureable high gradient. As a result, use of criteria specifically for the removal of readings near culture may be desirable.

In some instances measurement stations may be located close to conductive culture (e.g. an unknown buried power line or pipeline, grounding grid wire, etc.). A filter can be used to remove or not consider data from measurement stations that cannot be trusted due to a high probability that the data from such measurement stations may be influenced by surface culture. The cutoff distance for this filter can be determined by modeling and analysis of the data as some cultural features will carry more electric current than others.

The gradient filter and distance from culture criteria can often remove a majority of measurement stations affected by near-surface conductive culture. Nevertheless, in some cases there may yet remain a "gray zone" where some data is not filtered which may desirably be considered by subjecting the data to point-specific professional judgment. Removal of measurement stations using professional judgment may be performed, for example, where the above-described filters break down or are ineffective due to survey edges or gaps in the data, or from unknown and/or buried conductive culture. In any event, professional judgment can be used as criteria to determine the quality of measurement stations.

Mapping

If a measurement station is believed to be influenced by stray electric current flowing onto conductive culture, data from the measurement station can be removed (i.e., filtered) from the data set. The filtering/removal of data from the data set is a reduction of data and removal of interference. A magnetic field contour map can be generated that reflect magnetic field measurements substantially unaffected by surface culture. For reference purposes, stations that pass the quality control measures may be identified and distinguished on the magnetic field contour map from measurement stations removed after the various criteria have been applied and from measurement stations removed by professional judgment.

Figure 9:
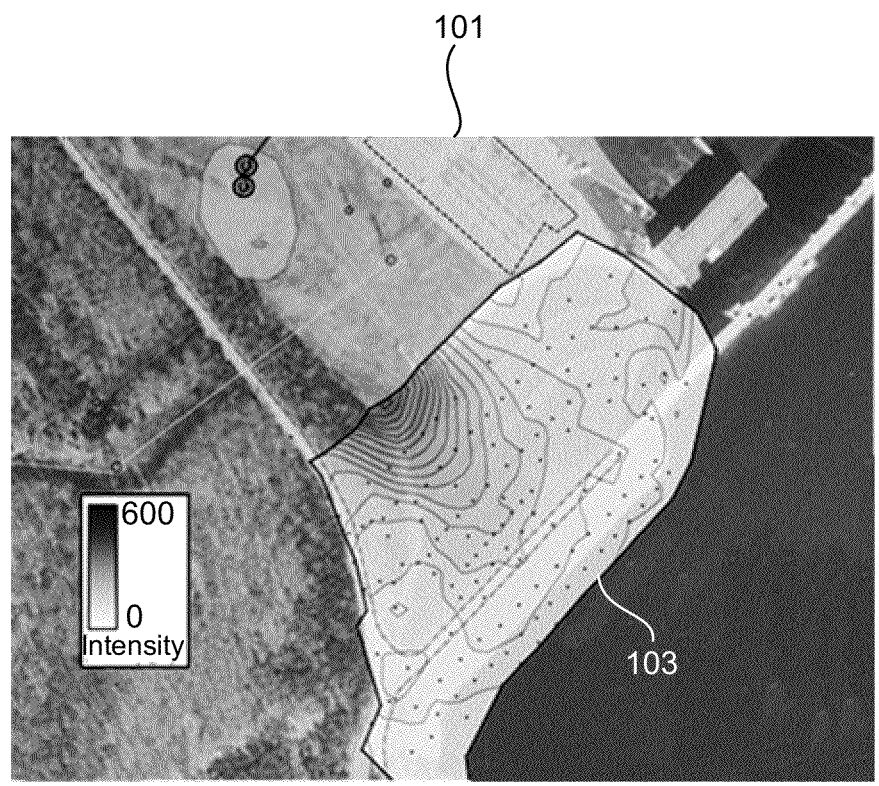
FIG. 9 illustrates a magnetic field contour map before correction for electrode bias and circuit wire position in accordance with an embodiment of the present technology.

Following initial data reduction and removal of cultural interference, a filtered horizontal magnetic field map or "footprint map" can be created to assist in identifying the electrical current distribution beneath the study area. FIG. 9 illustrates an example magnetic field contour map 103 overlayed on an aerial photograph 101 before correction for electrode bias, terrain, and circuit wire position. Therefore an interpretation of this map would be subject to effects of the terrain, the electrode bias, and the circuit wire. Otherwise, the shape of the contour lines reveals electric current flow patterns related to subsurface conductive pathways and is generally a more significant detail than the shading of magnetic field strength. By identifying high points and ridges and connecting such points and ridges together through the study area, the center position of preferential electric current flow can be identified.

In one aspect, data interpretation can include removal of the magnetic field distribution due to the position of the circuit wire, electrodes, and the local terrain with the assumption of a homogeneous Earth. Although the subsurface is not necessarily homogenous, an assumption can be made that the subsurface is homogenous in order to create a "background" model and its resulting predicted magnetic field map.

Figure 10:
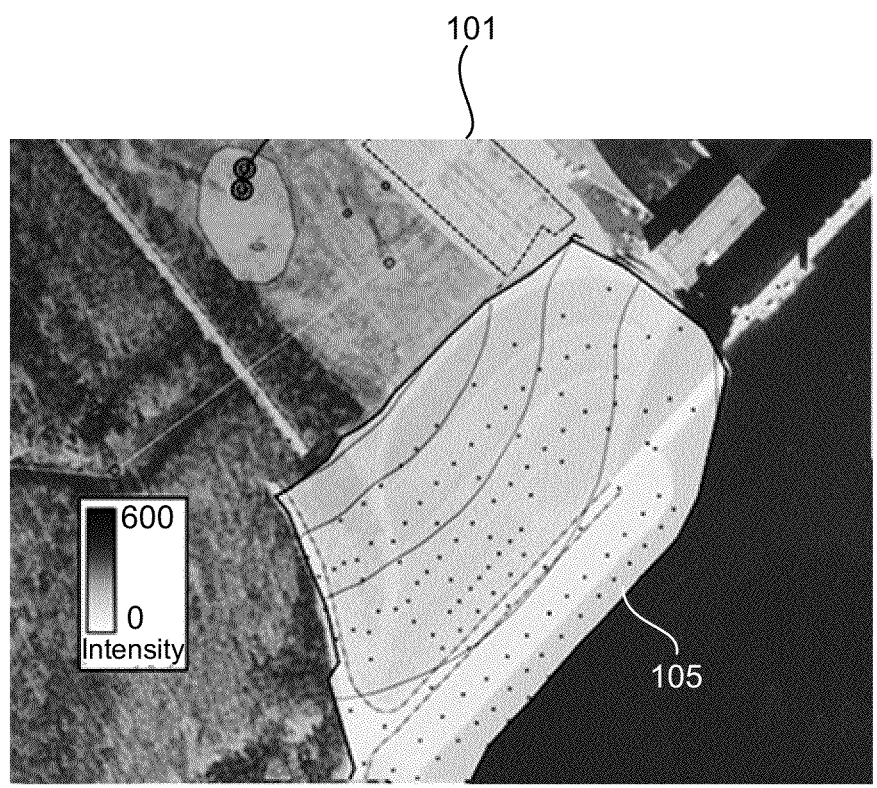
FIG. 10 illustrates a predicted magnetic field map in accordance with an embodiment of the present technology.

FIG. 10 shows a typical predicted magnetic field contour map 105 for an investigation based on the homogenous assumption. FIG. 10 further illustrates a homogeneous environment around a dam in which the magnetic field is created by placing electrodes on either side of the dam's embankment.

A comparison of the survey data with the predicted magnetic field model can be performed and the results can be presented in the form of a ratio response map. The ratio response map emphasizes subsurface heterogeneity by removal of the "background" or predicted portion of the acquired magnetic field data. The ratio response map can assist in distinguishing areas of greater or lesser conductivity through the subsurface study area. The ratio response map removes the effect of electric current bias and the resulting magnetic field due to the circuit wire and electrode positions, thereby highlighting areas of greater or lesser magnetic field intensity due to the subsurface electric current flow distribution.

Figure 11:
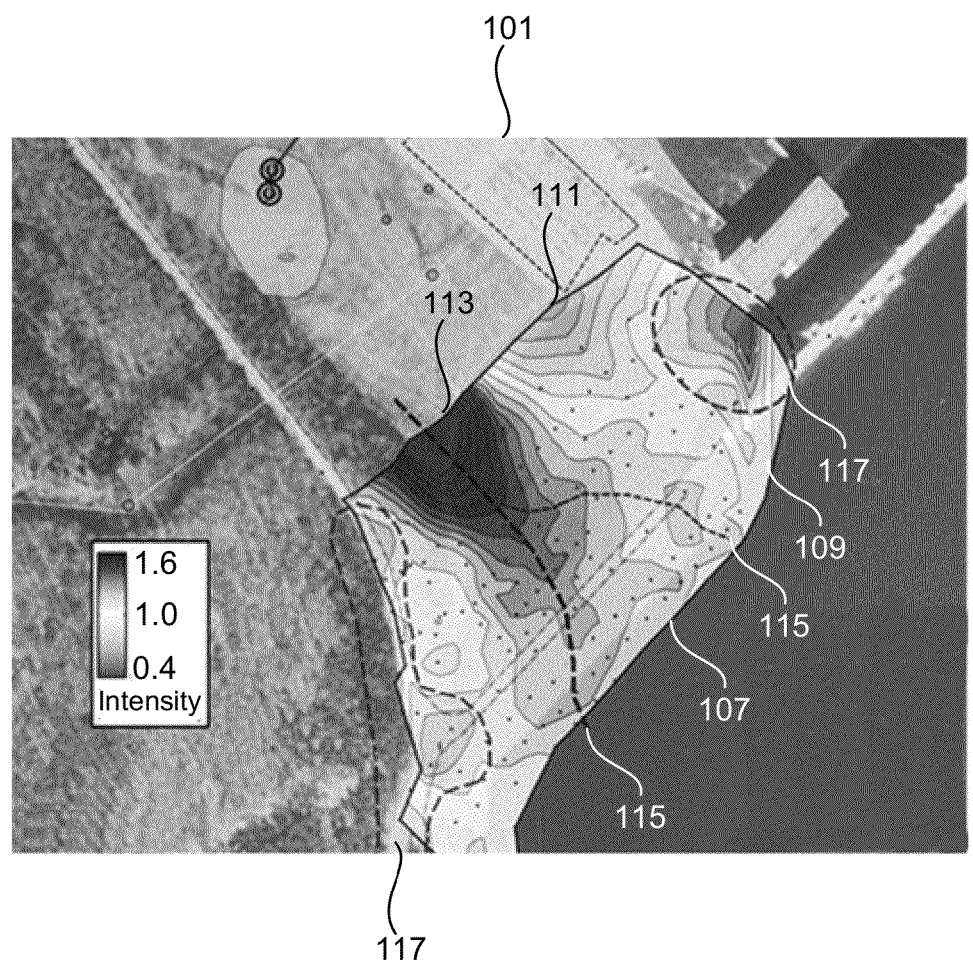
FIG. 11 illustrates a ratio response map in accordance with an embodiment of the present technology.

FIG. 11 illustrates an example ratio response map 107. The map can indicate areas where electric current intensity is approximately equivalent to that predicted by the homogeneous model (the lighter colored areas, such as 109, for example). The map can indicate where electric current flow is less than predicted, such as at 111. The map can also indicate where electric current flow is greater than predicted, such as at 113. The areas where electric current flow is greater than predicted based on the homogenous model can be used to identify a seepage or other flow paths 115. The areas where electric current flow is less than predicted are not overlooked. Such areas can provide insightful information and can help identify potential preferential flow paths as revealed by the shape of contour lines. FIG. 11 further illustrates data affected by cultural interferences 117 which can be ignored and/or removed from the data.

A ratio response map, as shown in FIG. 11 visualizes the horizontal flow of electric current through the survey area.

Electrical current flow (ECF) paths 115 are identified from the ratio response map. Electric current amperage can be estimated for each identified ECF path. The flowpath depth, position and width of the flow path can be adjusted by trial-and-error process until the predicted magnetic field matches that of the measured one. Where magnetic field contour lines match fairly well with the identified flowpaths, the model can be identified as a possible solution for electric current flow in the subsurface.

Figure 12:
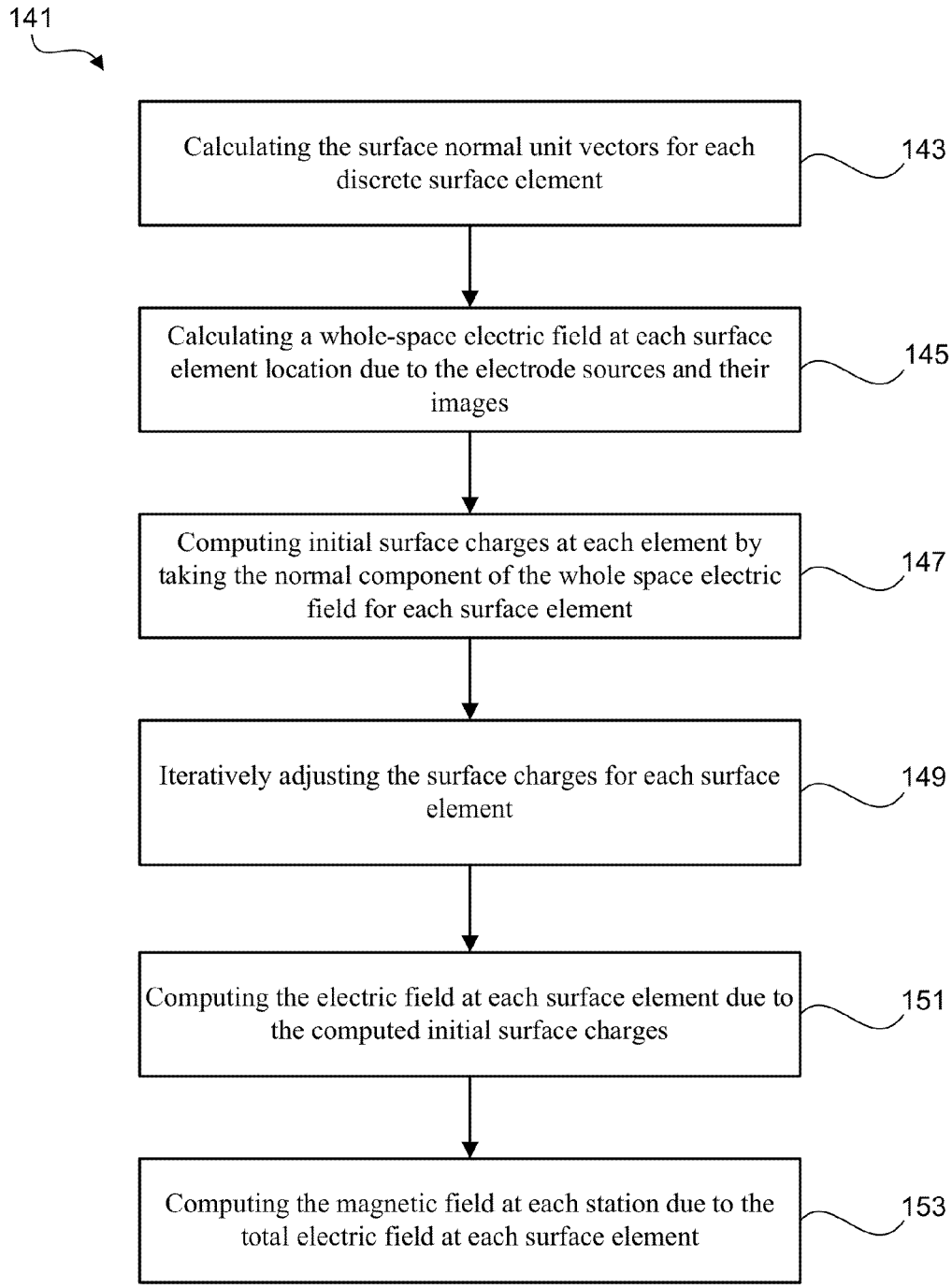
FIG. 12 is a flow diagram of a method for terrain correction in accordance with an embodiment of the present technology.

Referring to FIG. 12, a computer-implemented method 141 is illustrated for terrain correction by finite element numerical modeling. The terrain correction method of FIG. 12 produces a more accurate model of a predicted magnetic field, resulting in a more accurate ratio response map. The method can include calculating 143 the surface normal unit vectors for each discrete surface element, the surface being an area greater than the study area, and the surface element i or j being a discretized unit of the surface. For this step, let (x, y, z) define a point on a surface. The surface can then be defined as a function of two variables and represented by z=f(x, y). f(x, y) can be assumed to have continuous and finite partial first- and second-order derivatives at all points on the surface. A unit vector n, normal to the surface, is defined by the direction cosines ($n_x$, $n_y$, $n_z$), where $$n_x = \frac{-f_x}{(1+f_x^2+f_y^2)^{\frac{1}{2}}},$$

$$n_y = \frac{-f_y}{(1+f_x^2+f_y^2)^{\frac{1}{2}}},$$

and $$n_z = \frac{1}{(1+f_x^2+f_y^2)^{\frac{1}{2}}},$$

In a subsequent step of the method, a whole-space electric field $\vec{E}_f$ can be calculated 145 using the following formula for each electrode source and an associated image reflected over the surface topography. The whole-space electric field is calculated at each surface element due to the electrode sources and their images. The whole-space electric field $\vec{E}_f$ can be calculated using $$\vec{E}_f = \frac{I}{4\pi\sigma_1}\frac{\vec{r}}{r^3},$$

summed, for each source and image.

In a subsequent step of the method, initial surface charges can be computed 147 at each surface element by taking the normal component of $\vec{E}_f$ for each surface element. The normal component is the dot product of $\vec{E}_f$ from the previous step and the normal vectors from first step. In other words, t=$\vec{E}_f \cdot \hat{n}$.

In a subsequent step, the following equation, which includes adjustments for terrain variability, is used to iteratively adjust 149 the surface charges $q_i$ for each surface element i located at (x, y). Each surface element j represents primed position (x',y'), where the values for q from the previous iteration are substituted. For the first iteration, a substitution is made where q=t.

$$q_i = t_i - \sum_{j=1}^{m} q_j \cdot \frac{\vec{r}_{ij} \cdot \hat{n}_i}{2\pi \cdot R^3 n_{zj}} ds,$$

where m is the total number of surface elements and ds is the area of each surface element.

The method further includes computing 151 the electric field $\vec{E}_q$ at each surface element j, for j≠i, due to the charges computed in the previous step. This result is added to the whole space electric field computed in the second step above.

$$\vec{E}_{qi} = \frac{1}{2\pi}\sum_{j=1}^{m} \frac{q_j \vec{r}_{ij}}{R^3} ds_j$$

$$\vec{E} = \vec{E}_f + \vec{E}_q$$

The method can include computing 153 the magnetic field $\vec{B}_k$ at each station k due to the total electric field at each surface element j, as calculated from the previous step.

$$\vec{B}_k = \frac{-\mu\sigma_1}{4\pi}\sum_{j=1}^{m} \frac{\vec{E} \times \hat{n}}{r_{kj}} ds_j$$

Because a certain amount of error may be inherent in any numerical modeling approach such as with the above method, and the error may change for each application, another method can be used to "gauge" the amount of error in each case and make a correction for the error in the final calculation to obtain a more accurate final solution. The method generally includes comparing the numerical solution to an analytical solution that can be determined under certain conditions.

A first step is to define an area of terrain (i.e. the domain) which encompasses the survey and electrodes. This area of terrain is divided into small discrete elements, or is discretized. Optimally, the domain is at least 2-3 times the size of the smallest box encompassing the survey and electrodes.

The magnetic field result computed in the previous method is compared to the analytical solution of the magnetic field. This comparison reveals the amount of discrepancy or numerical error across the terrain surface elements for subsequent adjustment.

The method above can be performed again with the actual variable terrain included to compute the magnetic field.

Adjustment to the magnetic field computed in the previous step with the actual variable terrain can be made based on the amount of numerical error determined above.

In instances where terrain is flat, there is an analytical solution that gives the exact answer to the magnetic field without the need for a numerical modeling approach. This analytical solution is given by the following equation:

$$B = \frac{\mu I}{4\pi r}(1-\cos\theta) = \frac{\mu I}{4\pi r}\left(1 - \frac{d}{\sqrt{d^2+r^2}}\right)$$

where B is the magnetic field, μ is the permeability of free space constant, d is the depth to an electrode source, I is the amount of electric current, and r is the horizontal distance from a point of observation to the electrode source.

The filtered magnetic field map, predicted magnetic field map, and ratio response map are provided to identify preferential electric current flow from a "map view" perspective. To better characterize the preferential pathways in three dimensions (3D), multiple modeling methodologies are described herein based on the Biot-Savart relationship. One method utilizes a powerful inversion method to produce a subsurface Electric Current Distribution (ECD) model. Inversion algorithms provide an electric current intensity distribution within a volume of subsurface based on the magnetic field measurements. The ECD inversion model does not take into account the vertical component of electric current flow or enforce the conservation of the electric current.

Another method is Electric Current Flow or ECF modeling which uses discrete channels or ribbons of current to simulate the observed magnetic field at the earth's surface. In other words, ECF modeling is a forward-modeling approach utilizing a number of discrete pathways that simulate the zones of the subsurface electric current flow exhibiting a high degree of channeling. These channels represent paths where electric current concentrates strongly in the subsurface. Once the preferential electric current flow paths have been identified in the horizontal dimension, a finite-element method can be used to simulate the magnetic field created by the electric current flow at some depth, and appropriate depth adjustments are made until the model produces a magnetic field response that fits the shape of observed anomalies. In some cases where the anomaly is tight and revealing, good accuracy can be achieved (depths to within 10% error). The horizontal resolution of the electric current flow is generally between one-fourth and one-half of the measurement station spacing. The vertical resolution depends largely on the degree of electric current channeling.

Figure 13A:
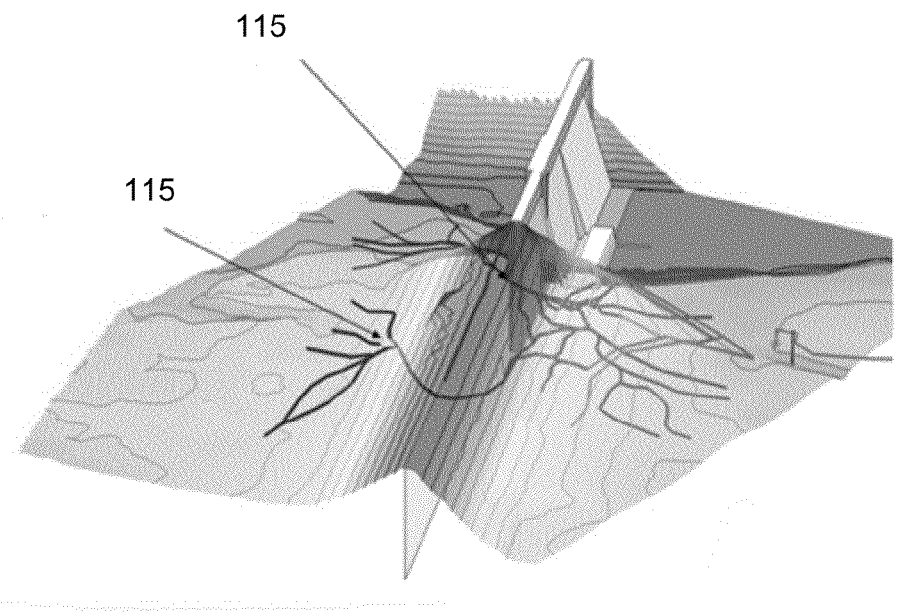
FIGS. 13A-13C are views of ECF and ECD models in accordance with embodiments of the present technology.
Figure 13B:
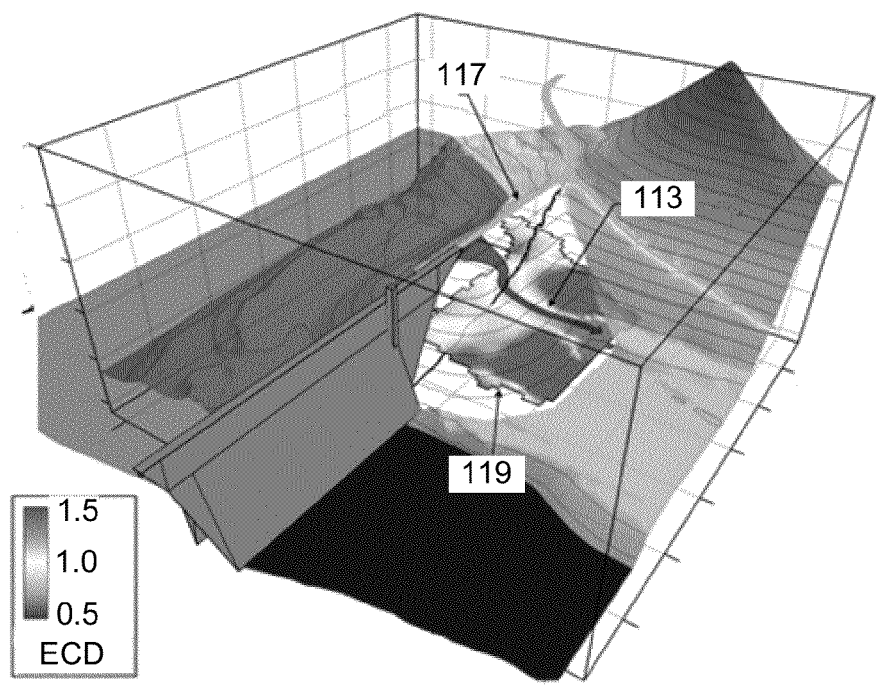
Figure 13C:
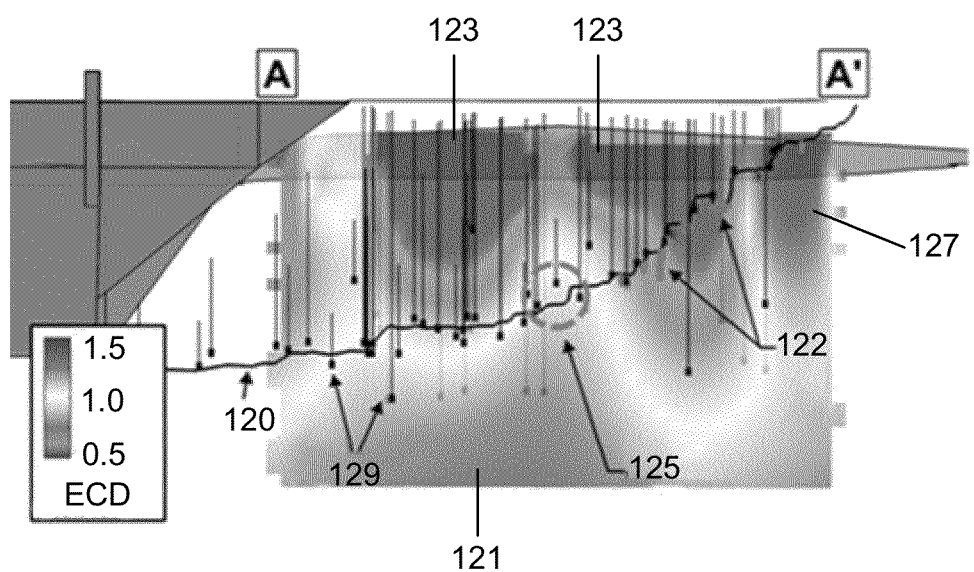

FIG. 13A illustrates an example of an ECF model with multiple different flow paths 115. FIGS. 13B and 13C portray horizontal and vertical slices, respectively, through an ECD inversion model, showing a leakage path 115 through an earthen embankment 117. The inversion model slice of FIG. 13C is taken at 119. In FIGS. 13B and 13C, shading 121 identifies areas of higher conductivity where electric current is more concentrated, while shading 123 identifies areas of lower conductivity where electric current is observed to be less concentrated. Because all the data is collected on the surface, the ECD inversion models always cast a downward "shadow" below an area where higher electric current flow (green shading) is detected. The effect is like shining a flashlight from above on a dark subsurface. Therefore, a preferential flow path can be discovered by the sharp transition from shading 123 to shading 121, or in this case where that transition is elevated above the bedrock 120 and any concrete filled cavities 122. This location is highlighted by circle 125. The strong anomaly 127 on the upper right side can be dismissed as being caused by near-surface conductive culture. FIG. 13C also illustrates piezometers 129 within the subsurface.

ECD models can be generated and analyzed in the form of volume data. A model viewer can generate slices at any elevation or cross-section position within the volume. The inversion model and all associated information can be provided in common electronic formats for cross-compatible viewing, comparing, and analyzing the results of an investigation.

The modeling and interpretation of electric current flow distribution through the subsurface is a powerful tool for characterizing groundwater flow paths in most geologic settings, and is based upon widely known and accepted scientific theory and principles. Proper data interpretation involves an understanding of site geology, groundwater physical principles, electromagnetic theory, and practical experience. The present technology provides systems and methods for eliminating error in the data collection, data reduction/normalization, modeling and interpretive processes. The present technology can enable a quick and accurate characterization of groundwater conditions. The present technology can improve groundwater characterization efficiencies (cost and time) and to arrive at conclusive answers about specific groundwater issues. Surveys using the present technology may be particularly useful in helping identify and confirm groundwater flow path locations. The results obtained from a geophysical investigation may be used in conjunction with all known information at a site to make the most informed decisions regarding how to monitor and remediate groundwater problems.

Figure 14:
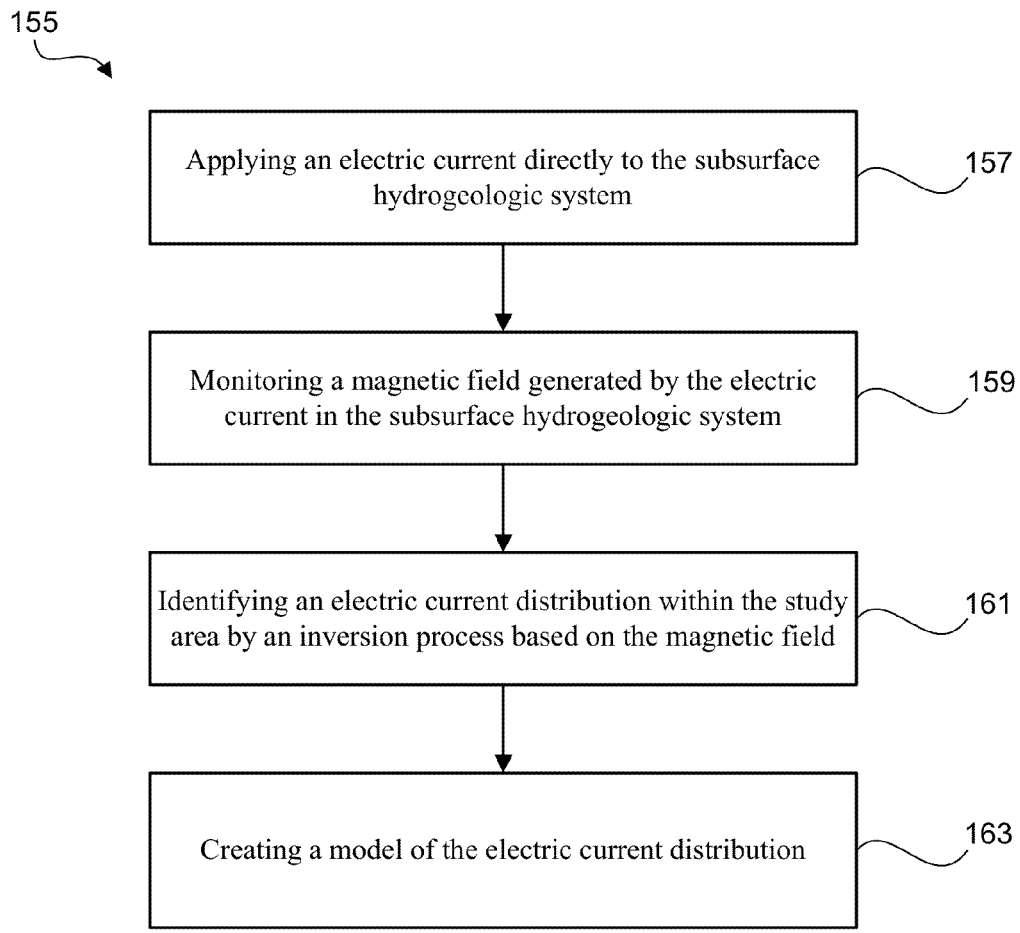
FIGS. 14-15 are flow diagrams of methods for modeling a subsurface hydrogeologic system in accordance with embodiments of the present technology.

Referring now to FIG. 14, a flow diagram of a method 155 for modeling a subsurface hydrogeologic system is illustrated in accordance with an example. The method can include applying 157 an electric current to the subsurface hydrogeologic system and monitoring 159 a magnetic field generated by the electric field in the subsurface hydrogeologic system over land and/or water surfaces. An electric current distribution can be identified 161 within the study area by an inversion process based on the magnetic field. A model of the electric current distribution can be created 163. The model can be a three-dimensional model.

The method steps of applying, monitoring, defining, and identifying can also be performed at additional locations with respect to the subsurface hydrogeologic system. In such examples, creation of the model can be based on a combination of the electric current distribution at multiple different locations.

The method can include analyzing the electric current distribution to identify zones of high and low transport porosity in the hydrogeologic system. The method can also include predicting a magnetic field for the study area based on an assumption of homogeneity of a subsurface and the subsurface hydrogeologic system.

In one aspect, the method can include creating a ratio response map identifying a relationship between a predicted model and observed magnetic field data, including areas where the electric current distribution in the hydrogeologic system is equivalent to, greater than, or less than the predicted model. The areas where electric current distribution is greater than the predicted model can identify fluid flow paths. Also, the ratio response map can remove an effect of electric current bias and a resulting magnetic field due to a circuit wire extending between electrodes for applying the electric current.

The method can include identifying near-surface interference near the subsurface hydrogeologic system, and correcting the identified electric current distribution based on the identified near-surface interference. Correcting the identified electric current distribution may further include filtering electric current distribution data based on at least one of a normalized gradient filter, a distance from a culture, and point-specific professional judgment. One or more aspects of filtering can be applied automatically by a processor according to predefined rules and/or by a human operator manipulating data displayed on a display device using a user input device to cause the filtering operations to be performed by the processor.

The method can further include creating a magnetic field contour map based on the magnetic field, and wherein identifying the electric current distribution within is based on the magnetic field contour map.

Figure 15:
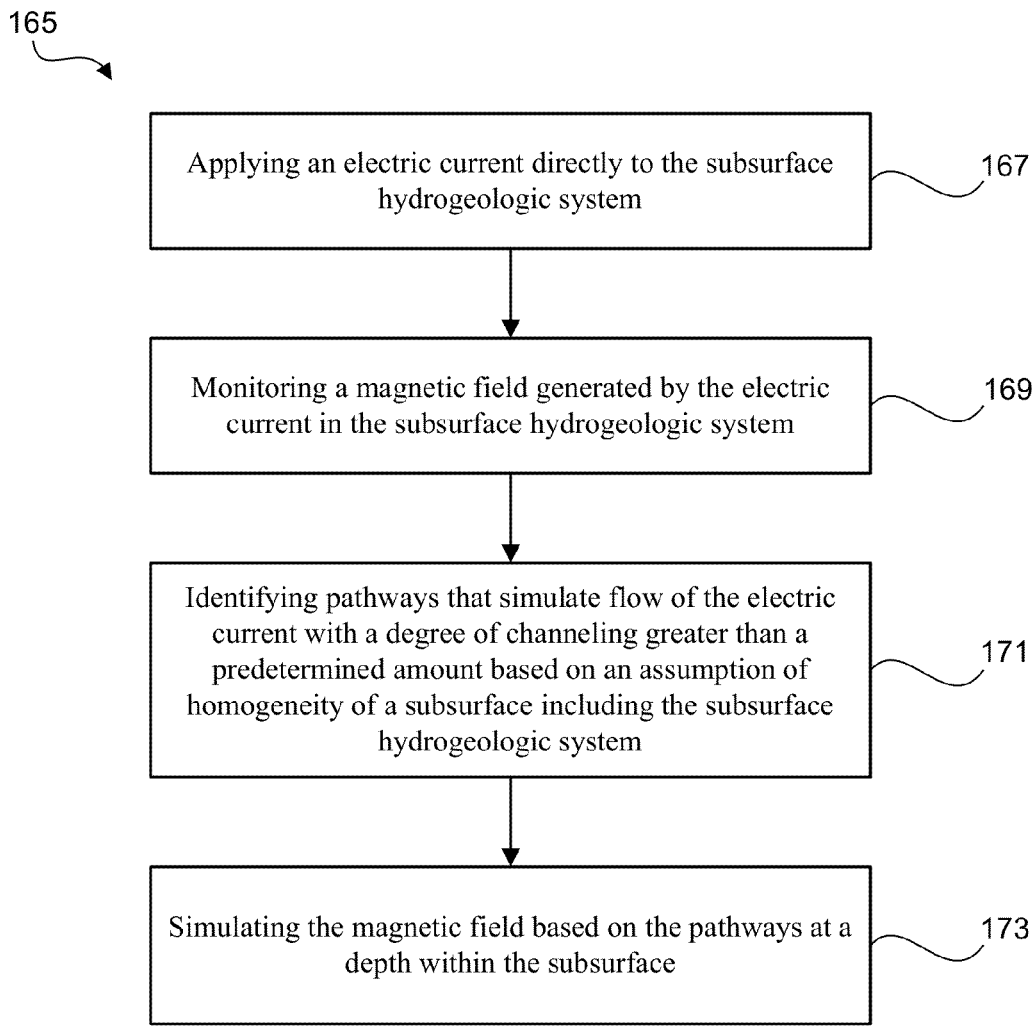

Referring now to FIG. 15, a flow diagram of a method 165 for modeling a subsurface hydrogeologic system is illustrated in accordance with an example. The method can include applying 167 an electric current to the subsurface hydrogeologic system and monitoring 169 a magnetic field generated by the electric field in the subsurface hydrogeologic system. Pathways can be identified 171 that simulate flow of the electric current with a degree of channeling greater than a predetermined amount based on an assumption of homogeneity of a subsurface including the subsurface hydrogeologic system. The magnetic field can be simulated 173 based on the pathways at a depth within the subsurface. Simulating the magnetic field at the depth can include applying finite element analysis to the pathways. The depth can be adjusted such that the simulated magnetic field corresponds to the monitored magnetic field. The pathways identified in this method can be identified in a horizontal position. A vertical position of the pathways can also identified by the simulating of the magnetic field at depth such that the simulated magnetic field corresponds to the monitored magnetic field. The method can also include creating a three dimensional model of the pathways.

In a further aspect, the method can include interpreting the electric current distribution in conjunction with other hydrogeologic system information to infer zones of high and low transport porosity in the hydrogeologic system.

The method can also include identifying near-surface interference near the subsurface hydrogeologic system, and correcting the identified electric current distribution based on the identified near-surface interference.

Figure 16:
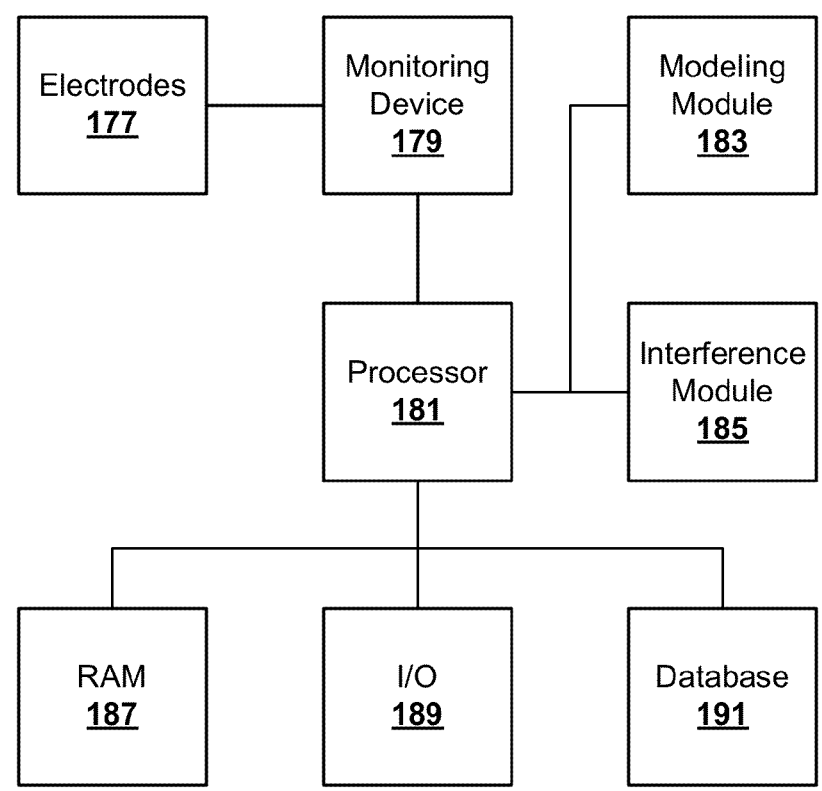
FIGS. 16-17 are block diagrams of systems for modeling a subsurface hydrogeologic system in accordance with embodiments of the present technology.

Referring now to FIG. 16, a block diagram of a system 175 for modeling a subsurface hydrogeologic system is illustrated in accordance with an example. The system can include electrodes 177 for applying an electric current to the subsurface hydrogeologic system and a monitoring device 179 configured to monitor a magnetic field generated by the electric field in the subsurface hydrogeologic system. A processor 181 can identify an electric current distribution within the study area by an inversion process based on the magnetic field and/or the processor can simulate identified pathways of the electric current with a degree of channeling greater than a predetermined amount based on an assumption of homogeneity of a subsurface including the subsurface hydrogeologic system. The pathways can be identified and refined, for example, by trial and error. A modeling module 183 can create a three dimensional model of the electric current distribution within the subsurface hydrogeologic system.

The system 175 can also include an interference module 185 configured to identify near-surface interference near the subsurface hydrogeologic system and filter electric current distribution data based on at least one of a normalized gradient filter and a distance from a culture.

The system 175 can further include processors, random access memory (RAM) 187, I/O buses 189, and other components for use by various modules in performing the described functionality of the modules. In one aspect, the memory can include program instructions that when executed by the processor function as the modules described above. Data obtained by monitoring and/or processing of monitored data can be stored on computer readable storage medium, such as in a database 191, which is accessible for display via a display screen of a computing device.

Figure 17:
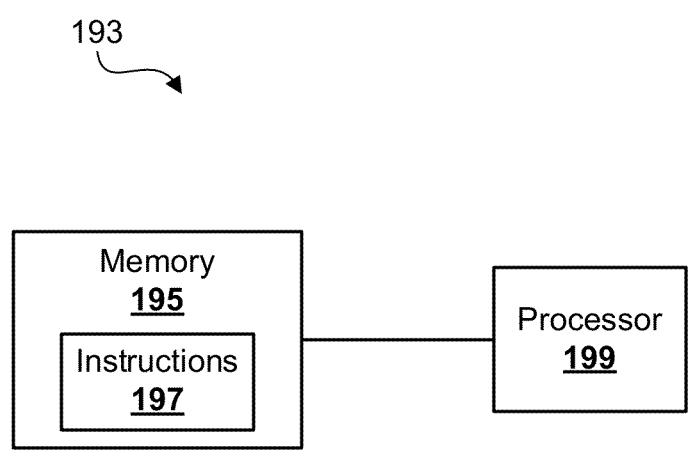

Referring now to FIG. 17, a block diagram of a system 193 for modeling a subsurface hydrogeologic system is illustrated in accordance with an example. A system and/or method can be implemented using a memory 195, processor 199, and/or computer readable medium. For example, an article of manufacture can include a memory or computer usable storage medium having computer readable program code or instructions 197 embodied therein, the comprising computer readable program code being capable of performing the operations of the methods described. In another example, the memory can include portable memory containing installation files from which software can be installed or remote memory from which installation filed can be downloaded. Also, program instructions stored in the memory can be embodied in installation files or installed files.

The systems and methods herein can quickly and accurately infer the location of groundwater and preferential flow paths. The systems and methods do not necessarily identify the volume of water or the direction of flow along a particular pathway, but such information can be determined by other field methods such as pump tests, water bearing formation characteristics, regional groundwater flow, topographic slope, potentiometric head differences, and so forth, which may be performed in conjunction with use of the present technology.

The present technology delineates and characterizes subsurface aqueous systems in complex hydrogeologic settings. Some example uses of the systems and methods herein include: 1) the diagnosis of seepage through earthen dams and levees; 2) characterizing groundwater infiltration into surface and subsurface mines; 3) tracking pollution plumes influenced by groundwater transport; 4) optimizing well placement for production and/or monitoring purposes; 5) identifying and mapping geothermal production zones; 6) delineating salt and fresh water reaction fronts; and 7) optimizing water flood activities in oil and gas recovery operations as well as other in-situ solution mining processes.

The methods and systems of certain examples may be implemented in hardware, software, firmware, or combinations thereof. In one example, the method can be executed by software or firmware that is stored in a memory and that is executed by a suitable instruction execution system. If implemented in hardware, as in an alternative example, the method can be implemented with any suitable technology that is well known in the art.

The various engines, tools, or modules discussed herein may be, for example, software, firmware, commands, data files, programs, code, instructions, or the like, and may also include suitable mechanisms.

Reference throughout this specification to "one example", "an example", or "a specific example" means that a particular feature, structure, or characteristic described in connection with the example is included in at least one example of the present technology. Thus, the appearances of the phrases "in one example", "in an example", or "in a specific example" in various places throughout this specification are not necessarily all referring to the same example. Furthermore, the particular features, structures, or characteristics may be combined in any suitable manner in one or more examples.

Other variations and modifications of the above-described examples and methods are possible in light of the foregoing disclosure. Further, at least some of the components of an example of the technology may be implemented by using a programmed general purpose digital computer, by using application specific integrated circuits, programmable logic devices, or field programmable gate arrays, or by using a network of interconnected components and circuits. Connections may be wired, wireless, and the like.

It will also be appreciated that one or more of the elements depicted in the drawings/figures can also be implemented in a more separated or integrated manner, or even removed or rendered as inoperable in certain cases, as is useful in accordance with a particular application.

Also within the scope of an example is the implementation of a program or code that can be stored in a machine-readable medium to permit a computer to perform any of the methods described above.

Additionally, the signal arrows in the Figures are considered as exemplary and are not limiting, unless otherwise specifically noted. Furthermore, the term "or" as used in this disclosure is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Various functions, names, or other parameters shown in the drawings and discussed in the text have been given particular names for purposes of identification. However, the functions, names, or other parameters are only provided as some possible examples to identify the functions, variables, or other parameters. Other function names, parameter names, etc. may be used to identify the functions, or parameters shown in the drawings and discussed in the text.

Some of the functional units described in this specification have been labeled as modules, in order to more particularly emphasize their implementation independence. For example, a module may be implemented as a hardware circuit comprising custom VLSI (Very Large Scale Integration) circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more blocks of computer instructions, which may be organized as an object, procedure, or function. Nevertheless, the executables of an identified module need not be physically located together, but may comprise disparate instructions stored in different locations which comprise the module and achieve the stated purpose for the module when joined logically together.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices. The modules may be passive or active, including agents operable to perform desired functions.

While the forgoing examples are illustrative of the principles of the present technology in one or more particular applications, it will be apparent to those of ordinary skill in the art that numerous modifications in form, usage and details of implementation can be made without the exercise of inventive faculty, and without departing from the principles and concepts of the technology. Accordingly, it is not intended that the technology be limited, except as by the claims set forth below.

What is claimed is:

1. A method of modeling a subsurface hydrogeologic system within a study area, comprising:
   applying an electric current directly to the subsurface hydrogeologic system;
   monitoring a magnetic field generated by the electric current in the subsurface hydrogeologic system;
   identifying an electric current distribution within the study area by an inversion process based on the magnetic field; and
   creating a model of the electric current distribution.

2. The method of claim 1, wherein the step of monitoring is performed over a water surface.

3. The method of claim 1, wherein the method is performed at a first location with respect to the subsurface hydrogeologic system, the method further comprising repeating the steps of applying, monitoring and identifying at a second location with respect to the subsurface hydrogeologic system, and wherein creating the model is based on a combination of the electric current distribution at the first location and the second location.

4. The method of claim 1, further comprising analyzing the electric current distribution to identify zones of high and low transport porosity in the hydrogeologic system.

5. The method of claim 1, further comprising predicting a magnetic field for the study area based on an assumption of homogeneity of a subsurface and the subsurface hydrogeologic system.

6. The method of claim 1, further comprising creating a ratio response map identifying a relationship between magnetic field data predicted by a magnetic field model and observed magnetic field data, including areas where the electric current distribution in the hydrogeologic system is equivalent to, greater than, or less than the electric current distribution predicted by the electric current distribution model.

7. The method of claim 6, wherein the areas where electric current distribution is greater than the electric current distribution predicted by the electric current distribution model identify fluid flow paths.

8. The method of claim 6, wherein the ratio response map removes an effect of electric current bias and a resulting magnetic field due to a circuit wire extending between electrodes for applying the electric current.

9. The method of claim 1, further comprising identifying near-surface interference near the subsurface hydrogeologic system, and correcting the identified electric current distribution based on the identified near-surface interference.

10. The method of claim 9, wherein correcting the identified electric current distribution comprises filtering electric current distribution data based on at least one of a normalized gradient filter, a distance from a culture, and point-specific professional judgment.

11. The method of claim 1, wherein creating the model comprises creating a three-dimensional model.

12. The method of claim 1, further comprising creating a magnetic field contour map based on the magnetic field, and wherein identifying the electric current distribution within is based on the magnetic field contour map.

13. The method of claim 1, further comprising applying terrain correction by:
   calculating surface normal unit vectors for each discrete surface element of a surface covering the subsurface hydrogeologic system;

calculating a whole-space electric field at each surface element location due to electrode sources of the electric current and associated images;

computing initial surface charges at each surface element by taking a normal component of the whole space electric field for each surface element;

iteratively adjusting the surface charges for each surface element;

computing the electric field at each surface element due to the computed initial surface charges; and computing the magnetic field at each station due to a total electric field at each surface element.

14. A method of modeling a subsurface hydrogeologic system, comprising:

applying an electric current directly to the subsurface hydrogeologic system;

monitoring a magnetic field generated by the electric current in the subsurface hydrogeologic system;

identifying pathways that simulate flow of the electric current with a degree of channeling greater than a predetermined amount based on an assumption of homogeneity of a subsurface including the subsurface hydrogeologic system;

simulating the magnetic field based on the pathways at a depth within the subsurface; and adjusting the depth such that the simulated magnetic field corresponds to the monitored magnetic field.

15. The method of claim 14, further comprising interpreting the electric current distribution in conjunction with other hydrogeologic system information to infer zones of high and low transport porosity in the hydrogeologic system.

16. The method of claim 14, wherein simulating the magnetic field at the depth further comprises applying finite element analysis to the pathways.

17. The method of claim 14, wherein the pathways are identified in a horizontal dimension and a vertical dimension of the pathways is identified by the simulating of the magnetic field.

18. The method of claim 14, further comprising identifying near-surface interference near the subsurface hydrogeologic system, and making corrections to the magnetic field data based on simulating the magnetic field due to pathways of electric current that are identified from the near-surface interference.

19. The method of claim 14, further comprising creating a three dimensional model of the pathways.

20. A system for modeling a subsurface hydrogeologic system, comprising:

a plurality of electrodes for applying an electric current directly to the subsurface hydrogeologic system;

a monitoring device configured to monitor a magnetic field generated by the electric field in the subsurface hydrogeologic system;

a processor configured to perform at least one of: i) identifying an electric current distribution within the study area by an inversion process based on the magnetic field, and ii) simulating identified pathways of the electric current with a degree of channeling greater than a predetermined amount based on an assumption of homogeneity of a subsurface including the subsurface hydrogeologic system; and a modeling module configured to create a three dimensional model of the electric current distribution within the subsurface hydrogeologic system.

21. The system of claim 20, further comprising an interference module configured to identify near-surface interference near the subsurface hydrogeologic system and filter electric current distribution data based on at least one of a normalized gradient filter and a distance from a culture.

22. The system of claim 20, wherein the identified pathways are refined by trial and error.

23. The system of claim 20, wherein the plurality of electrodes are positioned for the electric current to flow from a high hydraulic potential to a low hydraulic potential.

* * * * *